US012230940B2

(12) United States Patent
Srowig et al.

(10) Patent No.: US 12,230,940 B2
(45) Date of Patent: Feb. 18, 2025

(54) MECHANICALLY FREE LIDAR SYSTEM

(71) Applicant: Elmos Semiconductor SE, Dortmund (DE)

(72) Inventors: André Srowig, Heidelberg (DE); Bernold Rix, Iserlohn (DE)

(73) Assignee: Elmos Semiconductor SE, Dortmund (DE)

( * ) Notice: Subject to any disclaimer, the term of this patent is extended or adjusted under 35 U.S.C. 154(b) by 560 days.

(21) Appl. No.: 17/582,307

(22) Filed: Jan. 24, 2022

(65) Prior Publication Data

US 2022/0285910 A1 Sep. 8, 2022

(30) Foreign Application Priority Data

Jan. 25, 2021 (DE) .................. 10 2021 005 574.8
Jan. 25, 2021 (DE) .................. 10 2021 101 584.7
Nov. 5, 2021 (DE) .................. 10 2021 128 923.8

(51) Int. Cl.
*H01S 5/42* (2006.01)
*G01S 7/481* (2006.01)
*H01S 5/042* (2006.01)
*G01S 17/88* (2006.01)

(52) U.S. Cl.
CPC .......... *H01S 5/0428* (2013.01); *G01S 7/4815* (2013.01); *H01S 5/42* (2013.01); *G01S 17/88* (2013.01)

(58) Field of Classification Search
CPC ........ H01S 5/42; H01S 5/0428; H01S 5/0427; H01S 5/0683; H01S 5/06835; H01S 5/06; H01S 5/0608; H01S 5/0239
See application file for complete search history.

(56) References Cited

U.S. PATENT DOCUMENTS

| 6,697,402 B2 | 2/2004 | Crawford |
| 9,155,146 B2 | 10/2015 | Lee et al. |
| 9,185,762 B2 | 11/2015 | Mark et al. |
| 9,368,936 B1 | 6/2016 | Lenius et al. |
| 10,193,304 B2 | 1/2019 | Winer et al. |
| 2020/0278426 A1 | 9/2020 | Dummer et al. |

FOREIGN PATENT DOCUMENTS

| DE | 19 514 062 A1 | 11/1995 |
| DE | 19 546 563 C2 | 6/1997 |
| DE | 19 914 362 A1 | 10/1999 |
| DE | 10 2006 036 167 B4 | 2/2008 |
| DE | 10 2008 062 544 A1 | 6/2009 |
| DE | 10 2008 021 588 A1 | 12/2009 |

(Continued)

*Primary Examiner* — Xinning(Tom) Niu
*Assistant Examiner* — Delma R Forde
(74) *Attorney, Agent, or Firm* — Mindful IP PLLC; Michael J. McCandlish

(57) ABSTRACT

A laser module comprises a plurality of laser submodules with a respective plurality of lasers. Each laser submodule has a driver IC. Each driver IC controls several lasers. The driver ICs of the laser module can use the received signals of photodetectors to homogenize and readjust the real emission amplitude of the laser pulses for all lasers of the laser module and regulate the emission point in time of the respective real laser pulses to a synchronization signal. The driver IC can detect a failure of a laser by the photodetector belonging to it and output an error signal. The lasers directly coupled with the photodetectors in a compact design.

20 Claims, 8 Drawing Sheets

(56) References Cited

FOREIGN PATENT DOCUMENTS

| | | |
|---|---|---|
| DE | 10 2009 060 873 A1 | 7/2011 |
| DE | 10 2014 105 482 A1 | 10/2014 |
| DE | 10 2016 116 875 A1 | 3/2017 |
| DE | 10 2016 116 368 A1 | 3/2018 |
| DE | 10 2016 116 369 A1 | 3/2018 |
| DE | 10 2017 100 879 A1 | 7/2018 |
| DE | 10 2018 106 860 A1 | 9/2018 |
| DE | 10 2018 106 861 A1 | 9/2018 |
| DE | 10 2017 121 713 A1 | 3/2019 |
| DE | 10 2018 222 049 A1 | 6/2020 |
| EP | 2 002 519 A2 | 12/2008 |
| EP | 3 301 473 A1 | 4/2018 |
| JP | S62-232 987 A | 10/1987 |

MECHANICALLY FREE LIDAR SYSTEM

CROSS-REFERENCE TO RELATED APPLICATIONS

This application claims priority to German Patent Applications DE 10 2021 101 584.7 filed on Jan. 25, 2021, DE 10 2021 005 574.8 filed on Jan. 25, 2021 and DE 10 2021 128 923.8 filed on Nov. 5, 2021, the contents of which are incorporated into the subject matter of the present application by reference.

TECHNICAL FIELD

The disclosure is related to the optics for an ISO26262 compliant laser module and a LIDAR system based thereon without mechanical components.

BACKGROUND

LIDAR (an abbreviation for light detection and ranging), cf. Ladar (laser detection and ranging), is a radar-related method for optical distance and speed measurement, as well as for remote measurement of atmospheric parameters. Such LIDAR systems use laser beams instead of radio waves, which is the case with radar. Prior art preferably uses mechanical mirrors for deflecting the laser beams in different directions. Since these LIDAR systems are generally used in the field of autonomous driving and/or medical technology, LIDAR systems are preferably subject to safety requirements. An important standard for ensuring functional safety, or FuSa for short, in automotive applications is ISO 26262.

A driver circuit for an LED is known from DE 10 2009 060 873 A1. The technical teaching of DE 10 2009 060 873 A1 also leaves open how the components are to be assembled in order to minimize parasitic inductances and capacitances in an optimal manner.

Driver circuitry for light-emitting optoelectronic components is known from DE 10 2016 116 368 A1 (see FIG. 1 of DE 10 2016 116 368 A1), in which the charging circuitry (ref. numerals 2, 3, 4, 5, 9, 10, 11, 12, 13, 14 of DE 10 2016 116 368 A1) charges a capacitor (ref. numerals 18-21 of DE 10 2016 116 368 A1) via a series resistor (ref numeral 3 of DE 10 2016 116 368 A1). The light-emitting optoelectronic components (ref. numerals 22 to 25 of DE 10 2016 116 368 A1) are connected together with their cathodes to form a first star point. A control switch (ref. numeral 26 of DE 10 2016 116 368 A1) connects this star point to the reference potential (ref. numeral GND of DE 10 2016 116 368 A1), when one or more of the light-emitting optoelectronic components are to emit light. The buffer capacitor (ref. numeral 9 of DE 10 2016 116 368 A1) is used to quickly charge the actual energy reserves (ref. numerals 18 to 21 of DE 10 2016 116 368 A1).

DE 10 2016 116 368 A1 has the disadvantage that the series resistor leads to a poorer energy balance. The technical teaching of DE 10 2016 116 368 A1 also leaves open how the components are to be assembled in order to minimize parasitic inductances and capacitances in an optimal manner.

A driver circuit is known from U.S. Pat. No. 10,193,304 B2, in which the capacitors are charged, such that the current remains below the laser response threshold. The technical teaching of U.S. Pat. No. 10,193,304 B2 leaves open how the components are to be assembled in order to minimize parasitic inductances and capacitances in an optimal manner.

A compact, complex structure with four layers (2 circuit boards, capacitors, laser and switching IC) is known from EP 2 002 519 A2 (FIG. 2 of EP 2 002 519 A2), which, however, is too complex and slow for the solution sought here.

A control circuit for a single LED is known from EP 3 301 473 A1, which is suitable for emitting short pulses. It does not disclose how the low inductance required in EP 3 301 473 A1 can be achieved.

An LED driver circuit is known from DE 10 2016 116 369 A1, in which each LED has its own control switch, which increases the complexity and compromises the compactness of the device.

A laser control circuit is known from DE 10 2008 021 588 A1, in which a plurality of control switches is connected in parallel so that they can generate pulses with a time offset from one another and can cool down between the pulses, when the other control switches are able to generate further pulses.

DE 10 2017 121 713 A1 teaches control switches, which consist of sub-units in which each sub-unit has its own capacitor for providing switching energy.

A controller for a gas laser is known from DE 19 914 362 A1 and DE 19 514 062 A1.

A circuit for reducing the switch-off time of a laser diode is known from U.S. Pat. No. 9,185,762 B2 (DE 10 2014 105 482 A1).

A circuit for quickly switching a single laser diode on and off is known from DE 10 2017 100 879 A1. A setup example is also provided there. A favorable solution for a plurality of laser diodes is not specified.

A direct connection between a laser die of a single laser and the die of an integrated control switch is known from DE 10 2018 106 860 A1. The control switch is connected between the supply voltage and the anode of the laser diode, which, as will be explained below, prevents a particularly compact solution for a laser array.

A driver circuit (e.g., FIG. 12 of DE 10 2016 116 875 A1) with a common control switch (ref. numeral S3 of DE 10 2016 116 875 A1) for a plurality of lasers (ref, numerals D1, D7 of DE 10 2016 116 875 A1) is known from DE 10 2016 116875 A1, in which the common control switch (ref. numeral S3 of DE 10 2016 116 875 A1) is connected to the cathodes of the laser and is able to connect them to the reference potential. The energy for the laser pulse is derived from a common storage capacity (ref. numeral C of DE 10 2016 116 875 A1). The lasers are selected via separate switches (ref. numeral S2 of DE 10 2016 116 875 A1). This circuit has the disadvantage of a parasitic voltage drop across these switches (ref. numeral S2 of DE 10 2016 116 875 A1).

A laser driver circuit is known from DE 10 2006 036 167 B4, in which the resonances of the parasitic inductances and the capacitances are matched, such that they support specified properties of the light pulses to be generated.

A laser driver with a laser current detection via a shunt impedance between the cathode terminal and reference potential is known from U.S. Pat. No. 6,697,402 B2.

A single driver circuit is known from U.S. Pat. No. 9,368,936 B1. A coil is used as an energy store.

A circuit for supplying energy to an LED chain is known from U.S. Pat. No. 9,155,146 B2.

The control of a laser diode with an H-bridge is known from DE 10 2018 106 861 A1.

Driver circuitry is known from DE 19 546 563 C2, in which the charging circuitry is disconnected by an inductance from the laser diode for the short duration of the light pulse emission, when the control transistor initiates light emission.

A laser module for a mechanically free LIDAR system is known from German patent applications DE 10 2020 114 782.1, DE 10 2020 124 564.5 and DE 10 2020 111 075.8, which were not yet published at the date of the priority application of this specification, as well as of international patent application PCT/EP2021/050199 or the specifications resulting therefrom, which system comprises multiple laser submodules, which can be lined up next to one another, each with multiple lasers. The technical teaching of German patent applications DE 10 2020 114 782.1, DE 10 2020 124 564.5 and DE 10 2020 111 075.8, as well as international patent application PCT/EP2021/050199 do not yet disclose any consideration of safety-critical requirements and no technical teaching for satisfying these safety-critical requirements. FIGS. 1 to 6 are based on the technical teaching of unpublished German patent applications DE 10 2020 114 782.1, DE 10 2020 124 564.5 and DE 10 2020 111 075.8, as well as unpublished international patent application PCT/EP2021/050199. The essential new elements of the disclosure presented here have been added thereto.

A device for readjusting the emission time of the illumination laser of a TOF camera (TOF time of flight) is known from unpublished DE 10 2019 131 460.7.

A laser module with a plurality of VCSEL lasers is known from US 2020/0,278,426 A1. The technical teaching of US 2020/0,278,426 A1 discloses a monitor diode (reference numeral PD of US 2020/0,278, 426 A1 in FIG. 16) for readjusting the control of the VCSEL diodes.

However, the technical teaching of US 2020/0,278,426 A1 is inapplicable to the configuration presented here.

A technical teaching for a suitable control circuit is known from DE 10 2008 062 544 A1. The specification presented there, however, particularly refers to FIG. 4 of US 2020/0, 278,426 A1.

A laser module is also known from JP S62-232 987 A.

A device for optical time of flight measurement is known from DE 10 2018 222 049 A1.

SUMMARY

The disclosure is therefore based on the problem of creating a solution which does not have the above prior-art disadvantages and includes further advantages.

This problem is solved by a device according to the independent claims.

According to the disclosure, a laser module is made up of m laser submodules, which allows for the emission of particularly rapidly increasing laser pulses. For example, the laser module can comprise n lasers arranged linearly next to one another. The lasers are preferably semiconductor lasers which preferably have a common cathode contact.

The laser submodule has a linear laser array of n lasers (D1 to Dn), where n represents a positive integer greater than or equal to 1, preferably greater than or equal to 2, preferably greater than or equal to 4, preferably greater than or equal to 8, preferably greater than or equal to 16. The number n of lasers is preferably a power of 2. The laser module therefore comprises m*n lasers.

The n lasers (D1 to Dn) of a laser submodule of the laser module are preferably arranged along a first line with a preferably equal first pitch between each laser of the laser submodule. The n lasers (D1 to Dn) of a laser submodule of the laser module are preferably designed in the same way.

The n lasers (D1 to Dn) of a laser submodule of the laser module are preferably manufactured in a common crystal.

In this case, the n*m lasers of the laser module are preferably arranged as a whole also along the first line, which is preferably common to the laser submodules of the laser module, with a preferably equal and common first pitch from laser to laser of the laser module. The n*m lasers (D1 to Dn) of the laser module are preferably designed in the same way.

Each laser of the n lasers (D1 to Dn) of a laser module is preferably associated with exactly one capacitor of n capacitors as the respective energy source for its laser pulse. Whether or not a laser emits a laser pulse with the next pulse signal is preferably determined on the basis of whether or not the capacitor associated with this laser was previously charged by a charging circuit before the arrival of the pulse signal. These n capacitors are now preferably arranged along a second line. This second line of arrangement of the capacitors is preferably parallel to the first line of arrangement of the lasers. The second pitch from one capacitor to the next for the n capacitors, which are arranged along this second line, is preferably equal to the first pitch from one laser to the next within a laser submodule and preferably within the laser module with which distance the lasers are arranged along the first line. Thus, a linear capacitor array of n capacitors within a laser submodule and a linear capacitor array of n*m capacitors within a laser module are obtained.

Furthermore, a proposed laser submodule of the laser module has a laser submodule-specific control switch which is used to fire the lasers of the relevant laser submodule with charged capacitors of the laser submodule associated with these lasers of the laser submodule.

In order for a laser of a laser submodule to emit a laser pulse when the pulse signal arrives, charging circuitry of the laser submodule associated with this laser submodule capacitor must first charge the laser submodule capacitor associated with this laser. The laser submodule therefore preferably comprises n charging circuities of the laser submodule, wherein one charging circuit of the laser submodule of the n charging circuits of the laser submodule can selectively charge a respective laser submodule capacitor of the n capacitors of the laser submodule, hereinafter referred to as the laser submodule capacitor associated with this charging circuitry of the laser submodule, via a charging lead inductance belonging thereto. The size of this charging lead inductance has a positive effect on the discharge rate of the respective laser submodule capacitor and thus on the slope of the pulse edge, since this inductance separates the charging circuit of the laser submodule from the capacitor of the high-frequency laser submodule. This means that output capacitances of the charging circuit of the laser submodule no longer have any effect in the case of steep laser edges with a high charging lead inductance. The laser pulse is therefore potentially steeper due to the blocking charging lead inductance.

Thus, each laser submodule capacitor of the n capacitors of the laser submodule is preferably associated with a laser of the laser submodule of the n lasers of the laser submodule in each case as a laser of the laser submodule associated with this laser submodule capacitor. When the pulse signal reaches the laser submodule control circuit, the laser submodule control switch is closed. In this case, the laser submodule control switch is preferably a transistor of an integrated circuit. By closing the laser submodule control switch, the control switch discharges the laser submodule capacitor of the n capacitors of the laser submodule that is charged via the laser of the laser submodule associated with this capacitor and a discharge line inductance, which preferably connects this capacitor with the anode of the laser to the laser submodule. The associated laser of the laser submodule can, of course, only emit a laser pulse when the pulse signal arrives and the laser submodule control switch subsequently closes, if the charging circuit of the laser submodule has previously charged the laser submodule capacitor associated with this laser of the laser submodule. By closing the control switch when the pulse signal arrives, the laser submodule control switch typically connects the cathode of the laser of the laser submodule to a reference potential of the laser submodule. The reference potential of the laser submodule is preferably equal to the reference potential of the laser module. Obviously, function-equivalent circuits are also conceivable, imaginable and/or possible, in which the anode and the cathode of the laser are interchanged.

The value of the charging lead inductance of a capacitor, which is used to power a laser of the laser submodule, should therefore be as high as possible. In contrast, the discharge line inductance of this capacitor, which runs across the associated with laser of the laser submodule, should be as small as possible. The connection from the anode of the laser of the laser submodule, used here as an example, to the capacitor belonging thereto and the lead inductance from the capacitor of the laser of the laser submodule to the reference potential of the laser submodule contribute to the discharge line inductance. In this case, the total discharge line inductance should in this case be as low as possible. For this electrical connection, it is typically advantageous to use multiple thin bonding wires for these connections instead of one thick bonding wire with a high current-carrying capacity. The reason is that the total inductance of the multiple bonding wires connected in parallel is lower than that of a thick bonding wire. Although a transformer coupling effect will come about between the bonding wires placed in parallel, the advantages of the low total inductance and thus the rapid switching times greatly outweigh this.

The charging lead inductance for a capacitor for powering a laser of the laser submodule should preferably have a maximized inductance value. The bonding wire length for connecting the first terminal of the relevant laser submodule capacitor to the charging circuit of the laser submodule associated therewith and the relevant laser of the laser submodule thus preferably has a maximum possible inductance value. This maximization of the bonding wire length maximizes this charge lead inductance as much as possible. The result is maximum separation between the parasitic output capacitances of the charging circuit and the anode of the relevant laser of the laser submodule.

Thus, the value of the charging lead inductance is preferably greater than the value of the discharge lead inductance.

The laser submodule preferably comprises integrated circuitry in which the cathodes of the n lasers of the linear laser array of n lasers are interconnected to form a star point without bonded wires. For this purpose, the laser submodule has a common rear contact, which in the example shown here represents the shared cathode for the n lasers of the laser submodule, directly connected to a contact of the laser submodule control switch, such that this laser submodule control switch is connected to the cathodes of the n lasers of the laser submodule at one terminal and with practically no inductance. In this case, the laser submodule integrated circuitry crystal conducts the waste heat from the n lasers of the laser submodule. The rear of the laser submodule linear laser array is thus thermally and electrically connected conductively to a contact of the laser submodule control switch, which is preferably monolithically integrated in the crystal of the preferably used laser submodule integrated circuitry. Bonding or soldering, or another suitable electrically and thermally conductive connection technology, such as, e.g., thermocompression of bond balls or another flip-chip assembly technique can, e.g., make this connection. The stack of the crystal of the laser submodule linear laser array and the laser submodule integrated circuitry crystal with the control switch and preferably with the charging circuit of the laser submodule is preferably thermally and also electrically conductively mounted with the back of the laser submodule integrated circuit on a heat sink, e.g., by means of thermally and preferably electrically conductive bonding or soldering.

As mentioned above, the laser submodule control switch and preferably the n charging circuits of the laser submodule for the n capacitors of the laser submodule capacitor array are part of the laser submodule integrated circuit. The laser submodule control switch is preferably electrically connected to the first star point of the laser submodule, which connects the cathodes of the n lasers of the laser submodule to one another without bonded wires.

In the laser submodule integrated circuitry crystal, as mentioned above, the laser submodule control circuitry and the n charging circuits of the laser submodule are preferably integrated in the active surface opposite the back of the crystal of the laser submodule integrated circuit. The n charging circuits of the laser submodule are thus part of the active surface of the laser submodule integrated circuit. That is to say, relative to the thickness of the crystal, they are placed substantially directly under the surface of the laser submodule integrated circuitry crystal or on its surface, as is customary with integrated circuits. The linear laser submodule capacitor array consisting of n capacitors of the laser submodule is now also attached in parallel to the laser submodule linear laser array consisting of n lasers of the laser submodule on the active surface of the monolithic laser submodule integrated circuitry crystal.

This parallelism relates not only to a temporal parallelism, but also to a spatial parallelism. The n lasers of the laser array of the laser submodule are preferably arranged along a first straight line. The n capacitors of the laser submodule capacitor array are preferably arranged along a second straight line. This straight line of the arrangement of the n capacitors of the laser submodule capacitor array is typically an imaginary line parallel to the second line. This imaginary line is typically located on the bottom of the laser submodule capacitor array. Similarly, the first line can be a further imaginary line on the bottom of the laser array of the laser submodule. These imaginary lines then define a plane, which is preferably identical to the active surface of the crystal of the preferably integrated electrical circuit of the laser submodule, or which is at least substantially parallel to this surface and spaced so little part by fastening means, such as a bonding agent or solder, such that it can be considered as substantially identical in this case. The bottom of the laser array of the laser sub-module is therefore preferably connected to the surface of the driver IC by means of an adhesive or a solder. The cathodes of the lasers of the laser sub-module are preferably electrically connected to the common star point (DISC), which is directly electrically connected to a corresponding electrical contact (DISC) of the driver IC (see FIGS. 4 and 5) by means of an adhesive or a solder, so that a so-called stacked die structure results, in which the crystals of the laser array and the driver IC are stacked directly on top of one another and spaced apart from one another only through the metallization and wiring stack of the integrated circuit of the driver IC and the electrically conductive adhesive or the electrically conductive solder, which mechanically and preferably electrically connect these two crystals to one another.

Each capacitor of the n capacitors of the laser submodule capacitor array has a first and second terminal. The first terminal of the capacitor of the linear laser submodule capacitor array is connected to the anode of the laser of the linear laser array of n lasers of the laser submodule associated with this capacitor for inductance reduction by multiple bonding with a first bonding wire length. The second terminals of the n capacitors of the laser submodule capacitor array are interconnected to form a second star point of the laser submodule. This second star point of the laser submodule is connected to a reference potential contact of the laser sub-module on the active surface of the crystal of the integrated circuit of the laser submodule by a plurality of bonding wires having a second bonding wire length for further inductance reduction. This design has significant advantages. If, e.g., the charging circuits of the laser submodule have only charged exactly one of the capacitors of the n capacitors of the laser submodule capacitor array and, as a result, all other capacitors of the laser submodule capacitor array are not charged, these uncharged capacitors are substantially charged to a near-zero voltage. When the pulse signal arrives, the laser submodule control switch now connects the first star point of the laser submodule with the reference potential of the laser submodule. As a result, a laser of the laser submodule, which is associated with the charged capacitor, initially discharges the relevant previously charged laser submodule capacitor. Subsequently, however, the laser submodule control switch also connects the first terminals of all the other capacitors of the laser submodule to the reference potential via their lasers. Since the capacitors belonging to these lasers are uncharged, these remaining capacitors similarly force the potential of the second terminals of these laser submodule capacitors, which form the second star point of the laser submodule, to be near the reference potential of the laser submodule. The first terminals of the capacitors of the laser submodule linear capacitor array are preferably connected to the charging circuit of the n charging circuits of the laser submodule associated with the respective capacitor of the n capacitors of the laser submodule capacitor array via a bonding wire with a third bonding wire length crossing the second star point of the laser submodule. Here, the third bonding wire length is preferably longer than the second bonding wire length. Here, the second bonding wire is preferably longer than the first bonding wire.

The thus-defined laser submodule can be used in a laser module of a LIDAR system. A LIDAR system comprises a basic structure as disclosed below.

For example, at a time of emission, the control circuit now causes, e.g., exactly one laser of the n lasers, e.g., exactly one of the m laser submodules of the laser module of the LIDAR system, to emit a laser light pulse by closing the control switch associated with this laser. An associated laser submodule charging circuit and an associated laser submodule capacitor are associated with this laser of this laser submodule. Thus, before the laser pulse is emitted, a control circuit causes this charging circuit of the n charging circuits of the laser submodule of the laser module described above, e.g., to charge the capacitor of the n capacitors of the laser submodule associated therewith. All other laser submodule capacitors should be uncharged. All other laser submodule capacitors should also remain uncharged for the duration of the process for the emission of a light pulse by this laser of the laser submodule.

For example, the laser submodule control circuit may include a timer. The start of the charging process by the charging circuit initiates the timer. The laser submodule control circuit preferably has several timers. When using timers, a timer is preferably associated with each laser of the n lasers of the laser submodule. In this case, the control circuit preferably thus comprises n timers. The timer of the charging circuit of the laser of the n lasers of the laser submodule, the capacitor of which charges the charging circuit, may be an analog or a digital counter. In the case of a digital counter, the counter preferably increases its counter reading by one increment for each cycle of a counting cycle. Preferably, all laser submodules use the same counting cycle. It is conceivable that each laser submodule of the m laser submodules uses its own counting cycle, however, a synchronization signal or a synchronization cycle synchronizes these modules with one another. All timers of the laser submodules of a laser module are preferably designed identically. Each timer generates a time value that increases strictly monotonically over time, which time value, depending on the type of timer, may be analog or digital. A comparison means, for example a comparator, preferably compares the current time value of the timer of the charging circuit, which is associated with this laser of this laser submodule of the m laser submodules of the laser module, with a charging time default value, which is associated with this laser of this laser submodule of the m laser submodules of the laser module. When the time value of the timer reaches or exceeds this charging time default value, the comparison means preferably generates a stop signal for the relevant charging circuit of the relevant laser of the relevant laser submodule. This charging circuit then terminates further charging of the relevant capacitor after receiving the stop signal. The amount of energy that is stored in the capacitor then results from the capacitance value of the capacitor, the preferably constant charging current of the charging circuit and the charging time. The charging time default value is preferably predefined or adjustable or calculable. According to the disclosure, a charging time default value is therefore preferably associated with each laser. Thus, e.g., a laser submodule may have n charging time default values for its n lasers. A laser module should therefore preferably have n*m charging time default values for its n*m lasers of its m laser submodules. For the technical teaching presented here, in contrast to the aforementioned prior art, it is now essential that a charging time default value of the n charging time default values of a laser submodule should depend on parameters of one or more actually emitted laser pulses of the associated laser of the n lasers of the laser submodule via a control loop.

Instead of the time control, the control circuit can also terminate the charging process by means of the charging circuit, when a capacitor target voltage is reached or exceeded. In the case of a constant charging current, the combination of constant charging current source and capacitor would then form the timer. In this case, the capacitor voltage would correspond to the time value. The comparison means can then detect the capacitor voltage and compare it with a default value. The comparison means may be a comparator which compares the capacitor voltage with a reference voltage. This default value, or reference voltage, then corresponds to said charging time default value. Thus, said comparator can, e.g., compare the capacitor voltage with the capacitor target voltage as the charging time default value, and generate a charging stop signal, which causes the control circuit to terminate the charging process by means of the relevant charging circuit. The charging circuit preferably charges the capacitor with a constant current from a charging current source, the current of which has a charging current source current value.

After completion of the charging process, e.g., a switch and/or high-impedance switching of the output of the charging circuit may disconnect the charging circuit from the capacitor to be charged. After the preferably one combination of laser and capacitor of the n pairs of laser and associated capacitor of a laser submodule is armed in this way by the charging of the relevant capacitor, the sudden discharge of this capacitor can now occur via the relevant laser and the laser submodule control switch by closing the laser submodule control switch. Hence, a laser submodule control circuit, which is preferably part of the laser submodule control circuit, preferably generates a pulse signal that preferably closes said control switch of the above-described laser submodule and thus, e.g., connects the cathode of the relevant laser of the laser submodule with the reference potential of the laser submodule. The appropriate charged capacitor is preferably connected with its second terminal to this reference potential of its laser submodule and preferably with its first terminal connected to the anode of the laser of the laser submodule associated with this capacitor. The previously charged capacitor thus suddenly discharges via the laser associated therewith. An electric current runs through the laser of the laser submodule, which is associated with this now discharging capacitor. Due to this current flow, the respective laser emits a light pulse. In this example, the other lasers of the n lasers of the laser submodule typically do not emit a light pulse, since here their associated charging circuits have not charged the capacitors of the laser submodule associated with them in accordance with the requirements of this example. Theoretically, it is possible for more than one charging circuit of a laser submodule or the laser module to charge the respective capacitor associated therewith. In other words, it is possible that upon termination of all charging processes, more than one laser submodule capacitor or the laser module is charged. In this case, it is conceivable to charge several capacitors of the laser module and not the other capacitors. When firing the lasers, the lasers in the laser module then light up according to a pattern. The LIDAR system can then gradually use different patterns. The LIDAR system can then recalculate the measurement results to the simple but theoretical case of a single charged laser module capacitor.

The LIDAR system preferably comprises one or more photodetectors. The use of photodetectors for measuring the distance to objects outside the LIDAR system is known from the above-cited prior art. Here, reference is made in particular to the technical teaching of German patent applications DE 10 2020 114 782.1, DE 10 2020 124 564.5 and DE 10 2020 111 075.8, as well as international patent application PCT/EP2021/050199, which are included herein by reference without further explanation.

The technical teaching of the specification presented here now proposes that the LIDAR system comprises at least one photodetector, which is optically and in a per-se known manner coupled to one or more lasers of the LIDAR system. Each laser module preferably has at least one photodetector which is optically and in a per-se known manner coupled to one or more lasers of the n*m lasers of the laser module. Even more preferably, each laser submodule has at least one photodetector, which is optically coupled to one or more lasers of the n lasers of the laser submodule in a per-se known manner. Even more preferably, each laser submodule has at least n photodetectors, which are each optically and coupled to exactly one or more lasers of the n lasers of the laser submodule in a per-se known manner, such that preferably exactly one photodetector of n photodetectors of the laser submodule is associated with each laser of the n lasers of a laser submodule.

In a first extreme case, a laser module thus has n*m such photodetectors. This is the case of maximum space division multiplexing. In a second extreme case, a laser module only has exactly one such photodetector. This is the case of maximum time division multiplexing. Intermediate forms are possible, as explained above. For the sake of brevity, the description will be limited to two extreme cases. However, the other intermediate possibilities are explicitly claimed, provided that the two extreme cases are covered by the claims.

For the sake of simplicity, it is assumed, e.g., that, e.g., exactly one charging circuit, e.g., of exactly one laser submodule of the laser module, charges the exactly one capacitor associated therewith. All other laser module capacitors remain uncharged. At the beginning when a start signal is received by the laser submodule control circuit, the laser submodule control circuit preferably generates for each laser of the n lasers of the laser submodule, but at least for the laser of the laser submodule, the capacitor of which is charged, a start signal, which is delayed by a preferably adjustable delay time, and is preferably specific for this laser, and thus specific for this laser of the laser submodule. One or more delay times may also be 0s. For the relevant laser, its delayed start signal, at a delayed start time specific to this laser, signals that the control circuit should close the control switch of the exactly one laser submodule of the laser module at this start time. If the capacitors of several lasers are charged, this no longer works properly, if the laser-specific delay times of the lasers with charged capacitors differ from one another. The laser submodule control circuit can then use as the delay time, e.g., the mean of the delay times of the lasers of the laser submodule, the capacitors of which are charged. Therefore, only one capacitor of a laser of a laser submodule is preferably charged in order to associate the delay time with exactly one laser of the laser submodule. By closing the laser submodule control switch, the exactly one previously charged laser submodule capacitor is discharged via the, e.g., exactly one laser of the laser submodule connected to, e.g., the exactly one capacitor. This capacitor then feeds a discharge current into the laser of the laser submodule associated therewith. For example, due to the discharge current, exactly this particular laser of the laser submodule emits a laser pulse. A scattering optics guides a preferably minimal, but sufficient for the technical purpose, portion of the light of the laser pulse to, e.g., exactly one photodetector of the laser submodule preferably associated with this laser of the laser submodule. This photodetector of the laser submodule receives a light pulse portion and generates a received signal of this exactly one photodetector, the value pattern over time of which depends on the value pattern over time of the received light pulse portion.

An evaluation device of the laser submodule, which is preferably part of the laser submodule control circuit, detects key parameters of the value pattern over time of the received signal of this photodetector, which is associated here, e.g., with the exactly one laser of the laser submodule.

One parameter of these parameters detected by the evaluation device of the laser submodule may be, e.g., the time shift between a leading edge of the start signal and the corresponding edge of the value pattern over time of the received signal. Another parameter of these parameters detected by the evaluation device of the laser submodule maybe, e.g., the maximum amplitude in the value pattern over time of the received signal, e.g., within a typically specified period of time following the start signal. Another possible parameter of these parameters detected by the evaluation device of the laser submodule may be, e.g., the time integral or a functionally equivalent value of the value pattern over time of the received signal, e.g., within a typically specified period of time following the start signal. A possible parameter of these parameters detected by the evaluation device of the laser submodule may also be, e.g., a sampling value of the value pattern over time of the received signal, e.g., at a specified point in time after the start signal.

Based on these parameters, the laser submodule control circuit can readjust the shape and position of the laser pulse.

The laser submodule control circuit may initially change the delay time associated with this laser of the laser submodule as a function of a parameter of the value pattern over time of the received signal. For example, more specifically, the laser submodule control circuit may change the delay time associated with this laser of the laser submodule as a function of the value of the detected time shift between the leading edge of the start signal and the corresponding edge of the value pattern over time of the received signal. This feedback preferably occurs via a filter. The filter preferably has integrating properties. The resulting regulator is preferably a PI or PID regulator. The laser submodule control circuit preferably regulates the delay time to assume a delay time target value.

First, the delay time target value can be specified by a numerical value. In this case, the control circuit regulates the delay time, such that the value of the detected time shift between the leading edge of the start signal and the corresponding edge of the value pattern over time of the received signal corresponds to this delay time target value.

The delay time target value can also be specified, e.g., by a synchronization signal signaling a synchronization time of the control circuit. The control circuit may comprise, e.g., a phase detector which, depending on whether the edge of the value pattern over time of the received signal corresponding to the leading edge of the start signal reaches the laser submodule control circuit before or after the arrival of the synchronization signal, increases or reduces the delay time for this laser of the laser submodule.

In other words, the start signal is then no longer determining for the temporal position of the laser pulse, but rather for the temporal position of the signaling of the synchronization time by the synchronization signal. The synchronization signal may carry out this signaling, e.g., by means of the rising or falling edge of a synchronization pulse.

If several laser submodules are each to fire a laser of the relevant laser submodule of the m laser submodules of the laser module, the LIDAR system can thus ensure, e.g., that, after regulating the various delay times of the relevant lasers of the various laser submodules of the laser module, the lasers of the laser submodules each emit their laser pulse synchronously at the same synchronization time. This increases the edge slope of the overall laser pulse of the overlapping laser pulses of the firing lasers of the m laser submodules of the laser module. This increases the range of such a total laser pulse and thus of the LIDAR system.

The detection of amplitude-dependent values of the value pattern over time of the received signal of a photodetector, which is associated with one of the n lasers of a laser submodule of the m laser submodules of a laser module, makes it possible to readjust the amplitude to an amplitude default value. For this purpose, the control circuit compares the relevant amplitude-dependent value of the value pattern over time of the received signal of a photodetector with an amplitude default value.

If the relevant amplitude-dependent value of the value pattern over time of the received signal of the photodetector is less than the amplitude default value, the control circuit increases the amount of energy that the charging circuit of the capacitor of this laser of the n lasers of the laser submodule provides for the relevant laser in order to generate the next laser pulse by charging the capacitor of this laser.

To increase the amount of energy of the capacitor, the control device can first increase the charging current with which the charging circuit charges the capacitor of the laser, as a function of the value of the deviation between the amplitude-dependent value of the value pattern over time of the received signal of the photodetector and the amplitude default value.

Second, in order to increase the amount of energy of the capacitor in the case of time-controlled charging of the capacitor, the control circuit can increase the charging time default value, e.g., as a function of the value of the deviation between the amplitude-dependent value of the value pattern over time of the received signal of the photodetector and the amplitude default value.

Third, in order to increase the amount of energy of the capacitor in the case of capacitor voltage-controlled charging of the capacitor, the control circuit can increase the capacitor target voltage, e.g., as a function of the value of the deviation between the amplitude-dependent value of the value pattern over time of the received signal of the photodetector and the amplitude default value.

If the relevant amplitude-dependent value of the value pattern over time of the received signal of the photodetector is greater than the amplitude default value, the control circuit reduces the amount of energy that the charging circuit of the capacitor of this laser of the n lasers of the laser submodule provides to the relevant laser for generating the next laser pulse by charging the capacitor of this laser. To lower the amount of energy of the capacitor, the control device can first lower the charging current with which the charging circuit charges the capacitor of the laser, as a function of the value of the deviation between the amplitude-dependent value of the value pattern over time of the received signal of the photodetector and the amplitude default value. Second, in order to reduce the amount of energy of the capacitor in the case of time-controlled charging of the capacitor, the control circuit can lower the charging time default value, e.g., as a function of the value of the deviation between the amplitude-dependent value of the value pattern over time of the received signal of the photodetector and the amplitude default value. Third, in order to reduce the amount of energy in the capacitor in the case of capacitor voltage-controlled charging of the capacitor, the control circuit can lower the capacitor target voltage, e.g., as a function of the value of the deviation between the amplitude-dependent value of the value pattern over time of the received signal of the photodetector and the amplitude default value.

If the capacitor target voltage of a laser of the n lasers of a laser submodule of the m laser submodules of the laser module falls short of a specified or programmed lower capacitor target voltage threshold during the control, the control circuit uses a capacitor target voltage shortfall signal to signal an optionally higher-level unit that the capacitor target voltage falls short of the lower capacitor target voltage threshold. Such a capacitor target voltage shortfall signal would have to be provided for each laser of the n lasers of a laser submodule. Usually, it is preferable if the laser submodule control circuit has a laser submodule data interface. In the event of such an error, the control circuit then preferably changes a flag in a register of the laser submodule data interface from a first logical value to a second logical value. The first logical value is preferably the flag reset value. The second logical value, when the register is read out via the data interface of the readout unit, then signals that the capacitor target voltage falls short of the lower capacitor target voltage threshold when controlling the charging of the relevant capacitor of the relevant laser of the n lasers of the laser submodule. This signaling can be combined with additional signaling which, e.g., uses an interrupt line to signal the existence of an error to a higher-level computing unit without specifying it.

If the capacitor target voltage of a laser of the n laser of a laser submodule of the m laser submodules of the laser module exceeds a specified or programmed upper capacitor target voltage threshold during the control, the control circuit uses a capacitor target voltage excess signal to signal an optionally higher-level unit that the capacitor target voltage exceeds the upper capacitor target voltage threshold. Such a capacitor target voltage excess signal would have to be provided for each laser of the n lasers of a laser submodule. Usually, it is preferable if the laser submodule control circuit has a laser submodule data interface. In the event of such an error, the control circuit then preferably changes a flag in a register of the laser submodule data interface from a first to a second logical value. The first logical value is preferably the flag reset value. The second logical value, when the register is read out via the data interface of the readout unit, then signals that the capacitor target voltage exceeds the higher capacitor target voltage threshold when controlling the charging of the relevant capacitor of the relevant laser of the n lasers of the laser submodule. This signaling can be combined with additional signaling which, e.g., uses an interrupt line to signal the existence of an error to a higher-level computing unit without specifying it.

If the value of the charging current of the capacitor of a laser of the n lasers of a laser submodule of the m laser submodules of the laser module falls short of a specified or programmed lower charging current target threshold during the control, the control circuit uses a charging current target shortfall signal to signal an optionally higher-level unit that the value of the charging current falls short of the lower charging current target threshold. Such a charging current target shortfall signal would have to be provided for each laser of the n lasers of a laser submodule. Usually, it is preferable if the laser submodule control circuit has a laser submodule data interface. In the event of such an error, the control circuit then preferably changes a flag in a register of the laser submodule data interface from a first logical value to a second logical value. The first logical value is preferably the flag reset value. The second logical value then signals when the register is read out via the data interface of the readout unit that the value of the charging current falls short of the lower charging current target threshold when controlling the charging of the relevant capacitor of the relevant laser of the n lasers of the laser submodule. This signaling can be combined with additional signaling which, e.g., uses an interrupt line to signal the existence of an error to a higher-level computing unit without specifying it.

If the value of the charging current of the capacitor of a laser of the n lasers of a laser submodule of the m laser submodules of the laser module exceeds a specified or programmed upper charging current target threshold during the control, the control circuit uses a charging current target excess signal to signal an optionally higher-level unit that the value of the charging current exceeds the upper charging current target threshold. Such a charging current target excess signal would have to be provided for each laser of the n lasers of a laser submodule. Usually, it is preferable if the laser submodule control circuit has a laser submodule data interface. In the event of such an error, the control circuit then preferably changes a flag in a register of the laser submodule data interface from a first logical value to a second logical value. The first logical value is preferably the flag reset value. The second logical value, when the register is read out via the data interface of the readout unit, then signals that the value of the charging current exceeds the upper charging current target threshold when controlling the charging of the relevant capacitor of the relevant laser of the n lasers of the laser submodule. This signaling can be combined with additional signaling which, e.g., uses an interrupt line to signal the existence of an error to a higher-level computing unit without specifying it.

If the charging time default value of the capacitor of a laser of the n lasers of a laser submodule of the m laser submodules of the laser module falls short of a specified or programmed lower charging time target threshold during the control, the control circuit uses a charging time target shortfall signal to signal an optionally higher-level unit that the charging time default value falls short of the lower charging time target threshold. Such a charging time target shortfall signal would have to be provided for each laser of the n lasers of a laser submodule. Usually, it is preferable if the laser submodule control circuit has a laser submodule data interface. In the event of such an error, the control circuit then preferably changes a flag in a register of the laser submodule data interface from a first logical value to a second logical value. The first logical value is preferably the flag reset value. The second logical value, when the register is read out via the data interface of the readout unit, then signals that the charging time default value falls short of the lower charging time target threshold when controlling the charging of the relevant capacitor of the relevant laser of the n lasers of the laser submodule. This signaling can be combined with additional signaling which, e.g., uses an interrupt line to signal the existence of an error to a higher-level computing unit without specifying it.

If the charging time default value of the capacitor of a laser of the n lasers of a laser submodule of the m laser submodules of the laser module exceeds a specified or programmed upper charging time target threshold during the control, the control circuit uses a charging time target excess signal to signal an optionally higher-level unit that the charging time default value exceeds the upper charging time target threshold. Such a charging time target excess signal would have to be provided for each laser of the n lasers of a laser submodule. Usually, it is preferable if the laser submodule control circuit has a laser submodule data interface. In the event of such an error, the control circuit then preferably changes a flag in a register of the laser submodule data interface from a first logical value to a second logical value. The first logical value is preferably the flag reset value. The second logical value, when the register is read out via the data interface of the readout unit, then signals that the charging time default value exceeds the upper charging time target threshold, when controlling the charging of the relevant capacitor of the relevant laser of the n lasers of the laser submodule. This signaling can be combined with additional signaling which, e.g., uses an interrupt line to signal the existence of an error to a higher-level computing unit without specifying it.

If the value of the delay time associated with a laser of the n lasers of a laser submodule of the m laser submodules of the laser module falls short of a specified or programmed lower delay time threshold during the control the value of this delay time, the control circuit uses a delay time shortfall signal to signal an optionally higher-level unit that the value of the relevant delay time falls short of the lower delay time threshold. Such a delay time shortfall signal would have to be provided for each laser of the n lasers of a laser submodule. Usually, it is preferable if the laser submodule control circuit has a laser submodule data interface. In the event of such an error, the control circuit then preferably changes a flag in a register of the laser submodule data interface from a first logical value to a second logical value. The first logical value is preferably the flag reset value. The second logical value when the register is read out via the data interface of the readout unit then signals that the value of the relevant delay time falls short of the lower delay time threshold when controlling the value of the relevant delay time of the relevant laser of the n lasers of the laser submodule. This signaling can be combined with additional signaling which, e.g., uses an interrupt line to signal the existence of an error to a higher-level computing unit without specifying it.

If the value of the delay time associated with a laser of the n lasers of a laser submodule of the m laser submodules of the laser module exceeds a specified or programmed upper delay time threshold during the control the value of this delay time, the control circuit uses a delay time excess signal to signal an optionally higher-level unit that the value of the relevant delay time exceeds the upper delay time threshold. Such a delay time excess signal would have to be provided for each laser of the n lasers of a laser submodule. Usually, it is best if the laser submodule control circuit has a laser submodule data interface. In the event of such an error, the control circuit then preferably changes a flag in a register of the laser submodule data interface from a first logical value to a second logical value. The first logical value is preferably the flag reset value. The second logical value then signals when the register is read out via the data interface of the readout unit that the value of the relevant delay time exceeds the upper delay time threshold when controlling the value of the relevant delay time of the relevant laser of the n lasers of the laser submodule. This signaling can be combined with additional signaling which, e.g., uses an interrupt line to signal the existence of an error to a higher-level computing unit without specifying it.

If, contrary to expectations, the relevant laser of the n lasers of a laser submodule does not emit a laser pulse, the laser submodule control circuit can, e.g., detect the non-emission of the laser pulse by evaluating an amplitude-dependent value of the value pattern over time of the received signal of the photodetector and signal it using a flag as described above and/or a signal line.

In the event of the errors described above, the higher-level system can evaluate the error or errors and restrict or discard the data in terms of usability. This ensures that, e.g., a failure of an individual laser does not make the higher-level system incorrectly assume that there are no objects in the vehicle's path of travel.

It is particularly advantageous to use the laser module described above in a LIDAR system described previously.

The disclosure furthermore comprises a laser module with m laser submodules (m being a positive integer). Each laser submodule preferably comprises a linear laser array of n lasers, n being a positive integer. The n lasers of a laser submodule are preferably assembled on a module support and/or a driver IC of the laser submodule. Each laser beam of each laser has a laser beam axis (SA1 to SAn). All laser beam axes (SA1 to SAn) and/or at least two laser beam axes (SA1, SA2) of the lasers of a laser submodule preferably intersect at one point. Based on this, an assembly of m laser submodules, m being positive integer, can be defined, in which each laser submodule has said linear laser array of n lasers, with n being a positive integer. The lasers of each laser submodule can preferably be numbered in the same way. Each laser beam of each laser preferably has a laser beam axis. Preferably, all of the respective laser beam axes (SA1 to SAn) of all n lasers of all m laser submodules of the laser module intersect at one point. At least the laser beam axes of at least two lasers of the n lasers of the m laser submodules of the laser module should intersect at one point. However, it is preferred that all m*n laser beam axes of all n*m lasers of all m laser submodules of the laser module intersect at one point. Alternatively, at least two laser beam axes of at least two lasers of the n*m lasers of all m laser submodules of the laser module can intersect at one point. The respective driver IC of a laser submodule is preferably a respective integrated circuit. Such a driver IC preferably has a rectangular shape. The driver IC of the respective laser submodule then preferably has two narrow sides and two long sides as edges. The driver IC of the respective laser submodule preferably has one or more contacts (DISC) on a first edge of the rectangle of its shape, which is a narrow side, which contact(s) are intended and suitable for contacting one or more back-side contacts of lasers. The driver IC of the respective laser submodule has contacts (VDDA, GNDA, VDDD, GNDD, VDDP, GNDP, VDDH, GND) on its second edge of the rectangle of its shape, which is a narrow side, which contacts are used to supply power to the driver IC and/or to said lasers (D1 to Dn) and/or to the associated energy storage (C1 to Cn). The first edge is preferably opposite the second edge.

The driver IC of the respective laser submodule preferably has at least one transfer contact for a signal on a third edge of the driver IC, which is a long side, which signal can be passed on to other driver ICs of other laser submodules. On a fourth edge of the driver IC, which is a long side, the driver IC has a further transfer contact, which is electrically connected to the transfer contact.

One of the transfer contacts is preferably a contact for a reset signal (RST), which places the driver IC of the respective laser submodule in a defined state. A transfer contact is preferably a contact for a trigger signal (TRIG), which causes the driver IC of the respective laser submodule in a specified signal state to fire its lasers (D1 to Dn), if provided based on the system state.

One or more transfer contacts are preferably intended for contacting signals from a data bus. The one or more transfer contacts on one edge of the driver IC of the respective laser submodule, which is a long side, are preferably directly electrically connected with one or more corresponding transfer contacts on the opposite edge of the driver IC of the respective laser submodule, which is the opposite long side. However, it is also conceivable that a linear data bus (e.g., a LIN bus) is interrupted at least temporarily by the driver ICs of the respective laser submodules as a bus node, and internal device components of the driver ICs of the respective laser submodules can receive the data on the one side of the respective driver IC and retransmit them on the other side of this driver IC, optionally, in modified form, in that case, the signals of the one or more transfer contacts on the one edge of the respective driver IC of the respective laser submodule, which is a long side, are processed prior to being retransmitted to one or more corresponding transfer contacts on the opposite edge of this driver IC, which is the opposite long side, in a sub-device of the driver IC, in particular in a data bus interface.

Furthermore, this specification comprises the disclosure of an assembly of laser submodules to form laser modules, in particular within a LIDAR system, with Fig., but at least two laser submodules, a first laser submodule and a second laser submodule, wherein the laser submodules have a rectangular shape with two narrow sides and two long sides, and wherein the laser submodules are arranged with their long sides next to one another.

The laser submodules each have a driver IC that can be lined up, as described above.

The driver ICs of the laser submodules are typically structurally identical in terms of the transfer contacts used for their driver ICs. In each case one transfer contact of the driver IC of the first laser submodule is then preferably electrically connected to the corresponding transfer contact of the driver IC of the second laser submodule by means of a single bonding wire per such transfer contact pair. This has the advantage that only minor losses occur. This is particularly advantageous for fast, synchronous transmission of the trigger signal (TRIG), since all lasers should fire in time and thus emit their radiation packet.

The disclosure also comprises a special capacitor array for a laser submodule and/or for an assembly of laser submodules to form a laser module and/or for use together with a driver IC, as described above. The capacitor array is rectangular and has a top and a bottom. The capacitor array has 'contact' (K1' to Kn') lined up along a first edge of the rectangle on the surface of the capacitor array. The capacitor array has a further contact (KG') which extends along a second side of the rectangle on the top of the capacitor array. The second side of the rectangle is opposite the first side of the rectangle. The extension of the further contact (KG') along the third and fourth sides is shorter than the extension of the third edge of the rectangle of the closest contact of the n contacts (K1' to Kn') along the third edge of the rectangle. The extension of the further contact (KG') along the third and fourth sides is shorter than the extension of the fourth edge of the rectangle of the closest contact of the n contacts (K1' to Kn') along the fourth edge of the rectangle. The capacitor array has a back contact (KR) that covers the bottom of the capacitor array. Each of the n contacts (K1' to Kn') forms a capacitance (C1 to Cn) with the back contact (KR), the further contact (KG') forming a further capacitance (CVDD) with the back contact (KR), and the capacitors (C1 to Cn and CVDD) preferably having a common dielectric, which extends between the n contacts (K1' to Kn') and the further contact (KG'), as well as the back contact (KR).

The proposed devices can be used as a LIDAR device or as part of such a LIDAR device in a mobile device. In this case, e.g., the mobile device mentioned can in particular be a robot, a missile, a space vehicle, a ship's hull, a watercraft, a vehicle, a rail vehicle, an aircraft, or a spacecraft.

The proposed devices may be used as a LIDAR device or as part of such a LIDAR device in automation technology. For example, they can be used in a device for detecting the shape of an object or a building or in a device for automating processes or in a device for three-dimensional detection of the shape of three-dimensional bodies. The proposed devices may also be used in medical devices or other devices for biometric measurement of organisms. The devices presented can, however, also be used in a generic fashion as 3D scanners.

The disclosure therefore initially relates to a laser submodule. The laser submodule preferably comprises a linear laser array of n lasers (D1 to Dn), n capacitors (C1 to Cn), a control switch ($T_{dis}$), n charging circuits (B1 to Bn) and a control circuit (CTR).

Here, n should be a positive integer greater than 2. Each capacitor of the n capacitors (C1 to Cn) has a first and a second terminal. Each charging circuit of the n charging circuits (B1 to Bn) can selectively charge one of the n capacitors (C1 to Cn). The following section refers to this capacitor as the "capacitor associated" with this charging circuitry. The control circuitry (CTR) controls the charging circuits (B1 to Bn). The interconnection thus preferably associates each capacitor of the n capacitors (C1 to Cn) with exactly one laser of the n lasers (D1 to Dn) as the "laser associated" with this capacitor. The control circuitry (CTR) controls the control switch ($T_{dis}$). In response to a signal from the control circuitry (CTR), the control switch ($T_{dis}$) discharges the capacitor of the n capacitors (C1 to Cn), which is charged, via the laser associated with this capacitor. After the control switch ($T_{dis}$) is closed by the control circuitry (CTR), the associated capacitor thus supplies the laser with electrical energy, which the charging circuitry associated with this capacitor has previously stored in the coupled capacitor. This laser associated with the capacitor only emits a laser pulse if the charging circuitry associated with the capacitor had previously charged the capacitor associated with this laser and if, at the time the laser pulse was emitted, the control switch ($T_{dis}$) connects the laser and thus the capacitor via the laser to a reference potential, such that a discharge current of the associated capacitor may flow through the relevant laser. The technical teaching of this specification now proposes that the laser submodule has at least one photodetector (PD1), in particular n photodetectors (PD1 to PDn). The laser associated with the capacitor to be discharged is preferably optically directly coupled to at least one photodetector via an optical path (oP1 to oPn). There is therefore expressly no diffuser or the like preferably in the beam path that deflects the beam path. This at least one photodetector now generates a received signal with a value pattern over time as a function of the amplitude pattern over time of the light pulse generation of the laser optically coupled to this photodetector, e.g., via said optical path. The control circuitry (CTR) determines a parameter of the value pattern over time of the received signal from the value pattern over time of the received signal of the photodetector associated with the laser. The technical teaching of this specification proposes that the control circuitry (CTR) controls the generation of a light pulse of the laser associated with the capacitor as a function of this parameter and preferably subsequently, monitors it by means of the associated photodetector and the associated received signal.

The parameter is preferably the value of the real time delay between the arrival of a time feature of a trigger signal (TRIG) as the start signal for the emission of a laser pulse by the associated laser at the control circuit (CTR) and the occurrence of a time feature for the real emission of the laser pulse in the value pattern over time of the received signal.

The technical teaching presented here defines the term of a delay time. This delay time begins with the arrival of the time feature of a trigger signal (TRIG) as the start signal for the emission of a laser pulse by the associated laser at the control circuit (CTR) as the start time. The control circuit (CTR) preferably causes the control switch ($T_{dis}$) to connect the associated laser to the reference potential after a specified and/or calculated and/or adjustable and/or programmable delay time has elapsed.

The control circuit (CTR) preferably regulates the delay time as a function of the parameter.

Here, the control circuit (CTR) preferably regulates the delay time to a nominal value, also referred to in this specification by the term delay target value.

The control circuit (CTR) preferably regulates the delay time, such that the point in time of the occurrence of the time feature for the real emission of the laser pulse in the value pattern over time of the received signal is synchronous with an optionally fixed temporal shift to a time feature in the value pattern over time of a synchronous signal. The time feature for the real emission of the laser pulse in the value pattern over time of the received signal can be, e.g., a rising or falling edge in the value pattern over time of the received signal. The time feature for the real emission of the laser pulse in the value pattern over time of the received signal can be, e.g., the point in time when a threshold value is exceeded by the value pattern over time of the received signal. The time feature for the real emission of the laser pulse in the value pattern over time of the received signal can be, e.g., the point in time when a maximum value occurs in the value pattern over time of the received signal.

In another embodiment, the parameter can be a value that is a function of the effect of the amplitude pattern over time of the laser pulse in the time value pattern over time of the received signal. This can be, e.g., a threshold value which must be exceeded or fallen short of in the value pattern over time of the received signal.

At a point in time prior to the closing of the control switch ($T_{dis}$), the control circuit (CTR) causes the charging circuit belonging to the laser to charge the capacitor belonging to the laser with a charging current. The control circuit (CTR) can preferably control the amount of energy with which the charging circuit can charge the capacitor.

The control circuit (CTR) preferably regulates the amount of energy with which the charging circuit can charge the capacitor as a function of the parameter.

The technical teaching presented here also describes the laser submodule with charge-time-controlled charging of the appropriate capacitor with the intended amount of energy.

When the amount of energy is timed, the control circuit (CTR) preferably causes the charging circuit to charge the capacitor to a capacitor voltage with a charging current having a charging current value, for the duration of a charging time. The duration of this charging time is typically limited by a charge time default value. The control circuit (CTR) regulates the amount of energy with which the charging circuit charges the capacitor during the time of charging as a function of the parameter, in that the control circuit (CTR) changes the charge time default value after emission of a laser pulse by the laser as a function of the parameter for the follow-on charge of the capacitor in preparation for the next emission of a laser pulse by this laser as a function of the parameter, when the amount of energy is time-controlled.

Preferably, when the amount of energy is time controlled, the control circuit (CTR) regulates the charge time default value, such that the value of the parameter of the value pattern over time of this received signal, which value is a function of the amplitude of the laser pulse emitted by this laser, corresponds to a preferably adjustable or programmable parameter default value of a nominal value.

When the amount of energy is time controlled, the control circuit (CTR) or another sub-device of the laser submodule preferably compares the charge time default value with an expected value interval of the charge time default value, which may, optionally, also be given by a single threshold for the value of the charge time default value.

When the amount of energy is time controlled, the control circuit (CTR) typically signals an error or generates the information about an error and/or stores it if the value of the charge time default value is outside the expected value interval of this value of the charge time default value.

The technical teaching presented here also describes laser submodules with capacitor voltage-controlled charging of the relevant capacitor with the intended amount of energy. The control circuit (CTR) causes the charging circuit to charge the capacitor with a charging current having a charging current value to a capacitor voltage for the duration of a charge time. The control circuit (CTR) detects the capacitor voltage for the duration of the charge time of the capacitor. The control circuit (CTR) causes the charging circuit to stop charging the capacitor with the charging current, when the value of the capacitor voltage reaches or exceeds the value of a capacitor target voltage. The control circuit (CTR) regulates the amount of energy, e.g., with which the charging circuit charges the capacitor for the duration of the charge time as a function of the parameter, such that the control circuit (CTR) changes the value of the capacitor target voltage after emission of a laser pulse by the laser as a function of said parameter for the follow-on charge of the capacitor in preparation for the next emission of a laser pulse by this laser as a function of said parameter.

The control circuit (CTR) preferably regulates the value of the capacitor target voltage, such that the value of the parameter of the value pattern over time of this received signal being a function of the amplitude of the laser pulse emitted by this laser corresponds to a preferably adjustable or programmable parameter default value as the nominal value.

The control circuit (CTR) or another sub-device of the laser submodule compares the value of the capacitor target voltage with an expected value interval of the capacitor target voltage. The expected value interval of the capacitor target voltage may, optionally, also be given by a single threshold for the value of the capacitor target voltage. In this case, the expected value interval extends, e.g., from the value of the capacitor voltage 0V to the value of the threshold, or from the value of the threshold to the value infinity. The control circuit (CTR) preferably signals an error or generates and/or stores the information about an error, if the value of the capacitor target voltage is outside the expected value interval of this the capacitor target voltage value.

The control circuit (CTR) preferably causes the charging circuit to charge the capacitor to a capacitor voltage with a charging current having a charging current value for the duration of a charge time. The control circuit (CTR) preferably regulates the amount of energy with which the charging circuit charges the capacitor for the duration of the charge time as a function of the parameter, such that the control circuit (CTR) changes the charging current value after emission of a laser pulse by the laser as a function of the parameter for the next follow-on charging of the capacitor in preparation for the next emission of a laser pulse by this laser as a function of said parameter.

The control circuit (CTR) preferably regulates the charging current value, such that the value of the parameter of the value pattern over time of this received signal being a function of the amplitude of the laser pulse emitted by this laser corresponds to a preferably adjustable or programmable parameter default value as a nominal value.

The control circuit (CTR) or another sub-device of the laser submodule preferably compares the charging current value with an expected value interval of the charging current value, which may, optionally, also be provided by a single threshold for the value of the charging current value. The control circuit (CTR) typically signals an error or generates and/or stores the information about an error, if the charging current value is outside the expected value interval of this charging current value.

The technical teaching presented here also describes a laser submodule as described above, wherein the control circuit (CRT) or another sub-device compares the value of the parameter of the value pattern over time of the received signal with an expected value interval, which may, optionally, also be given by a single threshold for the parameter. The control circuit (CRT) signals an error or generates and/or stores the information about an error if the value of the parameter of the value pattern over time of the received signal is outside the expected value interval of this value of the parameter of the value pattern over time of the received signal.

The technical teaching presented here also describes a laser module, wherein the laser module has several laser submodules as described above. In this case, the laser module has at least one first laser submodule, as described above, as such a laser submodule. In this case, the laser module has at least one second laser submodule, as such a laser submodule, as described above. The control circuits (CTR) of the first laser submodule and the second laser submodule regulate the amplitude of the laser pulses of the lasers of their respective laser submodules to the substantially same peak amplitude value and/or to the substantially same value of the time integral of the amplitude pattern of the laser pulses of the lasers of their respective submodule. Here, the term "same" means that the peak amplitude values and/or the values of the time integrals of the amplitude patterns of the laser pulses of the lasers of the first laser submodule do not vary by more than 10% and/or by more than 5% and/or by more than 2% from the peak amplitude values and/or the values of the time integrals of the amplitude patterns of the laser pulses of the lasers of the second laser submodule.

The technical teaching presented herein also describes a laser module, wherein the laser module has a plurality of laser submodules as described above. In this case, the laser module has at least one first laser submodule, as described above, as such a laser submodule. In this case, the laser module has at least one second laser submodule, as described above, as such a laser submodule. The laser module preferably has a synchronization signal (Sync) and a trigger signal (TRIG). The synchronization signal (Sync) and the trigger signal (TRIG) preferably are in a fixed temporal phase relationship. The synchronization signal (Sync) is preferably delayed by a fixed phase shift time with respect to the trigger signal (TRIG). The synchronization signal (Sync) and the trigger signal (TRIG) are generated either by a special sub-device of the laser module or one of the laser submodules. In the latter case, the control circuit (CTR) of the relevant laser submodule preferably generates the synchronization signal (Sync) and the trigger signal (TRIG) for preferably all laser submodules of the entire laser module. Hereinafter, this passage refers to the laser submodule that generates the synchronization signal (Sync) and the trigger signal (TRIG), as the master laser submodule, and the other laser submodules of the laser module as the slave laser submodules. The disclosure presented here thus discloses a laser module with a master laser submodule and at least one slave laser submodule, wherein the master laser submodule generates the synchronization signal (Sync) and the trigger signal (TRIG) for the slave laser submodules of the laser module. Thus, the first laser submodule is connected to the synchronization signal (Sync) and to the trigger signal (TRIG). The second laser submodule is connected to the synchronization signal (Sync) and to the trigger signal (TRIG). The control circuit (CTR) of the first laser submodule regulates the time delay between the occurrence of a time feature in the value pattern over time of the trigger signal (TRIG) and the emission of the laser pulse by the lasers of the first laser submodule, such that a time feature the amplitude patterns over time of the laser pulses of the lasers of the first laser submodule occurs substantially at the same point in time as a time feature of a synchronization signal (Sync). The control circuit (CTR) of the second laser submodule regulates the time delay between the occurrence of a time feature in the value pattern over time of the trigger signal (TRIG) and the emission of the laser pulses by the lasers of the second laser submodule, such that a time feature the amplitude patterns over time of the laser pulses of the lasers of the second laser submodule occurs substantially at the same point in time as the time feature of the synchronization signal (Sync). As a result, the lasers of the two laser modules always emit synchronously with the synchronization signal (Sync), such no falsification of the measured value of the light travel time as a function of laser pulses from different lasers from different laser submodules occurs.

The technical teaching presented here also describes laser submodule or laser module, wherein the laser module comprises at least one laser submodule, with m=1, and/or at least two laser submodules, with m=2, and/or m laser submodules. In the following section, they are referred to simply as laser module. The laser module comprises a plurality of m*n lasers (D1 to Dn) and at least one photo detector (PD1 to PDn). The laser module comprises at least one control circuit (CTR). The m*n lasers can each emit a laser pulse. At least one laser of the m*n lasers (D1 to Dn) is preferably coupled to the at least one photodetector of the photodetectors (PD1 to PDn) via an optical path (oP1 to oPn). The at least one photodetector (PD1 to PDn) preferably generates a received signal (es1 to esn) belonging exactly to this photodetector with a value pattern over time of this received signal. The value pattern over time of the at least one received signal (es1 to esn) of the at least one photodetector (PD1 to PDn) is a function of the amplitude pattern over time of a laser pulse emitted by the at least one laser of the m*n lasers (D1 to Dn). The laser module preferably has means (PD1 to PDn, es1 to esn) to verify the fact of the emission of a light pulse by the at least one laser using the value pattern of the at least one received signal (es1 to esn) of the at least one photodetector (PD1 to PDn). The laser module then generates an error message or an error signal by means of control circuit (CTR) or stores it for retrieval, if a laser pulse, which the at least one laser of the m*n lasers (D1 to Dn) was supposed to emit, does not cause a value pattern over time of the received signal (es1 to esn) of the at least one photodetector (PD1 to PDn), that has a value of a parameter of the value pattern over time of the received signal (es1 to esn) of the at least one photodetector (PD1 to PDn) within a predetermined parameter value range.

The technical teaching presented here also describes a laser module, wherein the laser module comprises at least two laser submodules, with m=2, and/or m laser submodules with m>0. Each of the m laser submodules preferably has a plurality of $n_j$ lasers (D1 to $Dn_j$) with $1 \leq j \leq m$. The number $n_j$ of lasers of a laser submodule may differ from one laser submodule to the next. The laser module preferably has at least one photodetector and/or a plurality of photodetectors (PD1 to $PDn_j$) per laser submodule. Each laser submodule preferably comprises at least one control circuit (CTR) of the relevant laser submodule. Each of the $n_j$ lasers of each laser submodule of the m laser submodules may typically emit a laser pulse. For each laser submodule of the m laser submodules, hereinafter referred to as "this laser module", preferably at least one laser of the $n_j$ lasers (D1 to $Dn_j$) of this laser submodule is coupled to the at least one photodetector of the photodetectors (PD1 to $PDn_j$) of this laser submodule via an optical path (oP1 to $oPn_j$) of this laser submodule. This at least one photodetector (PD1 to PDn) of this laser submodule preferably generates a received signal (es1 to esn) of this laser submodule that is belonging exactly to this photodetector with a value pattern over time of this received signal of this laser submodule. The value pattern over time of the at least one received signal (es1 to esn) of the at least one photodetector (PD1 to PDn) of this laser submodule typically is a function of the amplitude value pattern over time of a laser pulse emitted by the at least one laser of the $n_j$ lasers (D1 to Dn) of this laser submodule. This laser submodule preferably has means (PD1 to PDn, es1 to esn) to verify the fact of the emission of a light pulse by the at least one laser of this laser submodule using the value pattern over time of the at least one received signal (es1 to esn) of the at least one photodetector (PD1 to PDn) of this laser submodule. This laser submodule generates an error message or an error signal by means of control circuit (CTR) of this laser submodule, or stores it for retrieval, if a laser pulse, which the at least one laser of the $n_j$ lasers (D1 to $Dn_j$) of this laser submodule was supposed to emit, does not cause a value pattern over time of the received signal (es1 to esn) of the at least one photodetector (PD1 to PDn) of this laser submodule, that has a value of a parameter of the value paFig.me of the received signal (es1 to esn) of the at least one photodetector (PD1 to PDn) of this laser submodule within a predetermined parameter value range.

The technical teaching presented here also describes a laser module, wherein the laser module comprises at least one laser submodule with m=1, and/or two laser submodules, with m=2, and/or m laser submodules with m>0. Each of the m laser submodules preferably has a plurality of $n_j$ lasers (D1 to $Dn_j$) with $1 \leq j \leq m$. Here, the entire positive number $n_j$ of lasers of a laser submodule may vary from one laser submodule to the next. The laser module preferably comprises at least $n_j$ photo detectors (PD1 to $PDn_j$) per laser submodule. Each laser submodule preferably comprises at least one control circuit (CTR) of the relevant laser submodule. Each of the $n_j$ lasers of each laser submodule of the m laser submodules preferably can emit a laser pulse. Within each laser submodule of the m laser submodules, in this claim hereinafter referred to as "this laser module", preferably at least each laser of the $n_j$ lasers (D1 to $Dn_j$) of this laser submodule is most strongly coupled to exactly one photodetector of the $n_j$ photodetectors (PD1 to $PDn_j$) of this laser submodule via exactly one dominant optical path of at least $n_j$ optical paths (oP1 to $oPn_j$) of this laser submodule. Each of these $n_j$ photodetectors (PD1 to $PDn_j$) of this laser submodule generates exactly one received signal of $n_j$ received signals (es1 to $esn_j$) of this laser submodule, which is belonging exactly to this photodetector of the $n_j$ photo detectors (PD1 to $PDn_j$) of this laser submodule with a respective value pattern over time of this respective received signal of $n_j$ received signals (es1 to $esn_j$) of this respective laser submodule. The value pattern over time of the respective received signal (es1 to $esn_j$) of each photodetector of the $n_j$ photodetectors (PD1 to $PDn_j$) of this laser submodule typically is a function of the amplitude value pattern over time of a laser pulse emitted by the laser of the $n_j$ lasers (D1 to Dn) of this laser submodule, which is most strongly coupled to exactly this photodetector of the $n_j$ photodetectors (PD1 to $PDn_j$) of this laser submodule via exactly one dominant optical path of the $n_j$ optical paths (oP1 to $oPn_j$) of this laser submodule. This laser submodule typically has means (PD1 to $PDn_j$, es1 to $esn_j$) to verify, for each laser of the $n_j$ lasers (D1 to $Dn_j$), the event of the emission of a light pulse by exactly this laser of the $n_j$ lasers (D1 to $Dn_j$) of this laser submodule using the value pattern over time of the received signal coupled to this laser of the $n_j$ received signals (es1 to $esn_j$) of the photodetector of the $n_j$ photodetectors (PD1 to $PDn_j$) of this laser submodule, which is most strongly coupled to this laser, which is most strongly coupled to exactly this laser of the $n_j$ lasers (D1 to $Dn_j$) of this laser submodule via the exactly one dominant optical path of said $n_j$ optical paths (oP1 to $oPn_j$) of this laser submodule. This laser submodule generates an error message or an error signal by means of control circuit (CTR) of this laser submodule, or stores it for retrieval, if a laser pulse, which a laser of the $n_j$ lasers (D1 to $Dn_j$) of this laser submodule was supposed to emit, does not cause a value pattern over time of the received signal coupled to this laser of the $n_j$ received signals (es1 to $esn_j$) of the at least one photodetector of the $n_j$ photodetectors (PD1 to $PDn_j$) of this laser submodule, which has a value of a parameter of the value pattern over time of the received signal coupled to this laser of the $n_j$ received signals (es1 to $esn_j$) of the photodetector belonging to the $n_j$ photodetectors (PD1 to $PDn_j$) of this laser submodule outside a predetermined and, optionally, laser-specific parameter value range.

The proposed laser module enables the generation of synchronized, substantially equally intense, short light pulses and error monitoring of the light pulse emission of the lasers for the proposed LIDAR system, which does not require any moving components. The advantages are not limited thereto

DETAILED DESCRIPTION

Figure 1:
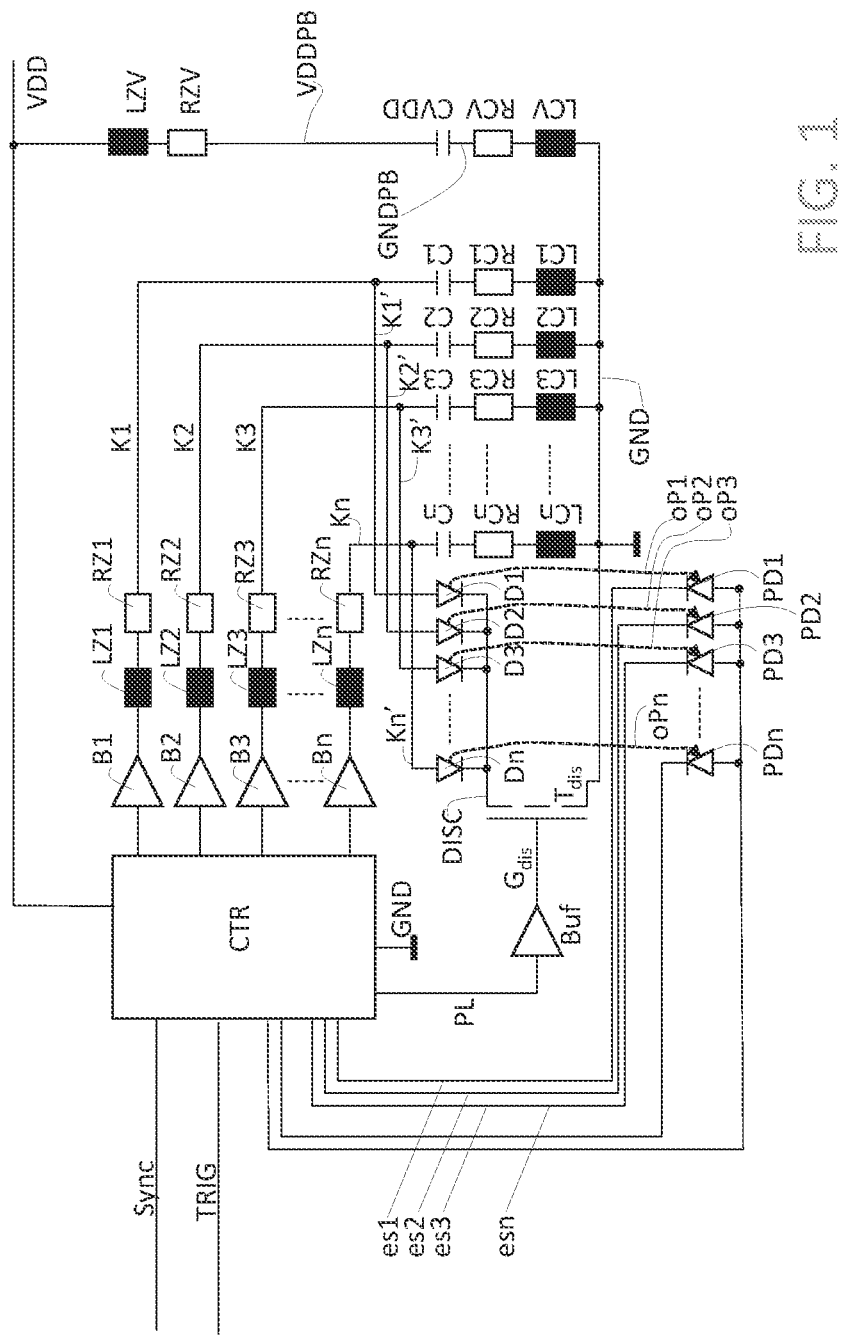
FIG. 1 shows an exemplary circuit for the proposed LIDAR system.

FIG. 1 shows an exemplary interconnection for the proposed laser submodule. A control circuit (CTR) causes a charging circuit of the n charging circuits (B1 to Bn) to charge one of the n capacitors (C1 to Cn) with a respective charging current via a charging line associated with this charging circuit of the n charging lines (K1 to Kn). It is conceivable that a plurality of charging circuits of the n charging circuits (B1 to Bn) each charge one of the n capacitors (C1 to Cn) with a respective charging current via one charging line associated with the respective charging circuit of the n charging lines (K1 to Kn). The respective charging current that is associated with one of the capacitors is preferably at a constant charging current value for the duration of the respective charging process of the respective capacitor of the n capacitors (C1 to Cn).

The circuit of FIG. 1 comprises n photodetectors (PD1 to PDn). Each of the photodetectors (PD1 to PDn) is associated with exactly one of the n lasers (D1 to Dn). It is particularly conceivable to provide fewer photodetectors per laser submodule. In the extreme case, a laser submodule may also have only one photodetector. In an even more extreme case, the laser module, as a whole, may only have one photodetector. The actual values for regulating the lasers can then be determined, e.g., by time division multiplexing, instead of space division multiplexing. Herein, for the sake of simplicity, maximum space division multiplexing, in which each laser of the n lasers (D1 to Dn) of a laser submodule is associated with exactly one photodetector of n photodetectors (PD1 to PDn), will be addressed.

When a laser of the n lasers (D1 to Dn) generates a laser pulse, a substantially fixed portion of the light of the laser pulse is transmitted to the associated photodetector of the n photodetectors (PD1 to PDn) of the exemplary laser submodule by means of a scattering device via an optical path belonging to this laser of n optical paths (oP1 to oPn).

The photodetector of the n photodetectors (PD1 to PDn) associated with this laser of the n lasers (D1 to Dn) detects this portion of the light of the laser pulse of the associated laser and converts it into a value pattern over time of a received signal associated with this laser of this photodetector associated with this laser. This received signal is thus exactly one of n received signals (es1 to esn) of the n photodetectors (PD1 to PDn). Each laser of the n lasers (D1 to Dn) is thus associated with exactly one received signal of the n received signals (es1 to esn) in this scenario of complete space division multiplexing.

As described above, the point in time of the emission of the laser pulse of a laser of the laser submodule may also be a function of the delay time between the start signal and the laser pulse of this laser detected by the photodetector associated with this laser, detected by the photodetectors (PD1 to PDn). It is particularly advantageous to detect the delay time between the leading edge of the start signal, e.g., the trigger signal (TRIG), and the corresponding edge in the chronological sequence of the received signal belonging thereto. In order to regulate the point in time of the emission of the laser pulse of a laser of the laser submodule, also as a function of the delay time between the start signal and the laser pulse detected by the photodetector associated with this laser, detected by the photodetectors, the control circuit detects a marked point in time in the value pattern of the start signal and a marked starting point in the time value pattern of the associated received signal and determines a value for the detected delay time from the value of the time difference.

First, the control circuit (CTR) can now regulate the point in time of the emission of the laser pulse of a laser of the laser submodule, such that the marked starting point in the value pattern over time of the associated received signal is synchronous with a target point in time at a predefinable target time interval from the marked point in time in the value pattern of the start signal, following the regulation.

Second, the control circuit (CTR) can now regulate the point in time of the emission of the laser pulse of a laser of the laser submodule, such that the marked starting point in the value pattern over time of the associated received signal is synchronous with a target point in time, which is a marked point in time in the value pattern of a synchronization signal (Sync), following the regulation. This may be, e.g., an edge in the synchronization signal (Sync).

As for delay time control of the point in time of the emission of the laser pulse of a laser of the laser submodule, the control circuit (CTR) evaluates the value pattern over time of the received signal associated with this laser of the n received signals (es1 to esn) in response to the emission of a laser pulse by this laser. The received signal of the n received signals (es1 to esn) is associated with exactly this laser in this scenario of complete space division multiplexing. The control circuit (CTR) can detect the value of a parameter of the value pattern over time of this received signal, which is a function of the delay of the laser pulse emitted by this laser compared with the start signal, e.g., the trigger signal (TRIG). In this case of delay time control and complete space division multiplexing, the control circuit (CTR) determines a new delay time for the delay of the pulse pre-signal (PL) before the next emission of the next laser pulse by this laser. The control circuit (CTR) uses this delay time as a basis when setting the delay of the pulse pre-signal (PL) compared with the start signal, that is to say, e.g., the trigger signal (TRIG), after the capacitor associated with this laser has been charged and in preparation for the emission of this next laser pulse by this laser. The control circuit (CTR) preferably regulates the delay time by filtering, which preferably has an integrating character, such that the regulation substantially corresponds to a P1 regulator in a first approximation.

Each capacitor of the n capacitors (C1 to Cn) is thus also associated with exactly one received signal of the n received signals (es1 to esn) in this scenario of complete space division multiplexing. Each charging circuit of the n charging circuits (B1 to Bn) is thus also associated with exactly one received signal of the n received signals (es1 to esn) in this scenario of complete space division multiplexing.

In the case of a time control of the capacitor charging process, the control circuit (CTR) causes the relevant charging circuit of the n charging circuits (B1 to Bn) to charge the associated capacitor of the n capacitors (K1 to Kn) for the duration of a charge time corresponding to a charge time default value for this relevant capacitor of this laser using the charging current according to a charging current value. The control circuit (CTR) evaluates the value pattern over time of the received signal of the n received signals (es1 to esn) in response to the emission of a laser pulse by said laser. In this case, the received signal of the n received signals (es1 to esn) is associated with exactly this laser in this scenario of complete space division multiplexing. The control circuit (CTR) can detect the value of a parameter of the value pattern over time of this received signal which is a function of the amplitude of the laser pulse emitted by said laser. In this case of time control and complete space division multiplexing, the control circuit (CTR) determines a new charge time default value for the emission of the next laser pulse by this laser. The control circuit (CTR) uses this charge time default value as a basis when controlling the charging of the relevant capacitor, which is associated with this laser, by the relevant charging circuit for setting the charge time in preparation for the emission of this next laser pulse by this laser. The control circuit (CTR) preferably regulates the charge time default value by filtering, which preferably has an integrating character, such that the regulation substantially corresponds to a PI controller in a first approximation. The control circuit (CTR) preferably regulates the charge time default value, such that the value of the parameter of the value pattern over time of this received signal, which is a function of the amplitude of the laser pulse emitted by this laser, corresponds to a preferably adjustable or programmable parameter default value as a nominal value.

As described above, the capacitor associated with a laser of the laser submodule can also be charged as a function of the capacitor voltage of this capacitor of the n capacitors (C1 to Cn).

In the case of capacitor voltage control of the capacitor charging process, the control circuit (CTR) causes the relevant charging circuit of the n charging circuits (B1 to Bn) to charge the associated capacitor of the n capacitors (K1 to Kn), until a capacitor target voltage for this relevant capacitor of this laser is reached, with the charging current corresponding to a charging current value. The control circuit (CTR) evaluates the value pattern over time of the received signal of the n received signals (es1 to esn) in response to the emission of a laser pulse by this laser. The received signal of the n received signals (es1 to esn) is associated with exactly this laser in this scenario of complete space division multiplexing. The control circuit (CTR) can again detect the value of a parameter of the value pattern over time of this received signal, which value is a function of the amplitude of the laser pulse emitted by this laser. In this case of capacitor voltage control and complete space division multiplexing, the control circuit (CTR) determines a new capacitor target voltage for charging the capacitor before the next laser pulse is emitted by this laser. The control circuit (CTR) is using this capacitor target voltage as a basis when controlling the charging of the relevant capacitor of this laser by the relevant charging circuit for setting the capacitor voltage after charging has taken place and in preparation for the emission of this next laser pulse by this laser. The control circuit (CTR) regulates the target capacitor voltage preferably by filtering, which preferably has an integrating character, such that the regulation substantially corresponds to a P1 regulator in a first approximation. The control circuit (CTR) preferably regulates the capacitor target voltage, such that the value of the parameter of the value pattern over time of this received signal, which value is a function of the amplitude of the laser pulse emitted by this laser, corresponds to a preferably adjustable or programmable parameter default value as a nominal value.

As described above, the capacitor associated with a laser of the laser submodule can also be charged by controlling the charging current value of the charging circuit of the n charging circuits (B1 to Bn), which charges this capacitor of the n capacitors (C1 to Cn) of this laser of the n lasers (D1 to Dn).

In the case of a charging current control of the capacitor charging process, the control circuit (CTR) causes the relevant charging circuit of the n charging circuits (B1 to Bn) to charge the associated capacitor of the n capacitors (K1 to Kn) for the duration of a charge time corresponding to a charge time default value for this relevant capacitor of this laser with the charging current according to a charging current value. The control circuit (CTR) evaluates the value pattern over time of the received signal of the n received signals (es1 to esn) in response to the emission of a laser pulse by this laser. The received signal of the n received signals (es1 to esn) is associated with exactly this laser in this scenario of complete space division multiplexing. The control circuit (CTR) can detect the value of a parameter of the value pattern over time of this received signal, which value is a function of the amplitude of the laser pulse emitted by this laser. In this case of charging current control and complete space division multiplexing, the control circuit (CTR) determines a charging current value for charging the capacitor, before the next laser pulse is emitted by this laser. The control circuit (CTR) uses this charging current value as a basis when controlling the charging of the relevant capacitor of this laser by the relevant charging circuit for setting the capacitor voltage after charging has taken place and in preparation for the emission of this next laser pulse by this laser. The controller (CTR) preferably regulates the charging current value by filtering, which preferably has an integrating character, such that the regulation substantially corresponds to a PI controller in a first approximation. The control circuit (CTR) preferably regulates the charging current value, such that the value of the parameter of the value pattern over time of this received signal, which value is a function of the amplitude of the laser pulse emitted by this laser, corresponds to a preferably adjustable or programmable parameter default value as a nominal value.

Each charging line of the n charging lines (K1 to Kn) typically has an associated impedance (of n impedances RZ1 to RZn) and an inductance (of n inductances LZ1 to LZn). Each of the charging lines (K1 to Kn) is preferably connected to a first terminal of exactly one capacitor of n capacitors (C1 to Cn). The second terminal of each capacitor of the n capacitors (C1 to Cn) is connected to the reference potential (GND) via a line. Each of the lines between a second terminal of a capacitor of the n capacitors (C1 to Cn) and the reference potential comprises an impedance (of n impedances RC1 to RCn) and an inductance (of n inductances LC1 to LCn). The anode of preferably exactly one laser of the n lasers (D1 to Dn) is preferably connected to a first contact, of preferably exactly one capacitor of the n capacitors (C1 to Cn), via preferably exactly one discharge line of the n discharge lines (K1' to Kn'). The cathodes of the n lasers (D1 to Dn) are interconnected to form a common first star point (DISC). When the pulse signal ($G_{dis}$) arrives, this common star point is connected to the reference potential (GND) through the control switch ($T_{dis}$), which reference potential (GND) is connected to the second contact of the n capacitors (C1 to Cn).

An exemplary driver (Buf) generates the pulse signal ($G_{dis}$) from the pulse pre-signal (PL). The control circuit (CTR) can preferably generate this pulse pre-signal (PL) when the charging process for the capacitor to be charged by the associated charging circuit has been completed and the charging circuit is switched to neutral.

A back-up capacitor (CVDD) is preferably part of the capacitor array of n capacitors (C1 to Cn). The back-up capacitor (CVDD) stabilizes the supply voltage (VDD) or another system-relevant voltage. It is used to prevent crosstalk of the current surges when the laser is fired.

The first contact of the back-up capacitor (CVDD) is connected to the supply voltage (VDD) or a line with a similar function, which is to be stabilized, via a line inductance (LZV) in the feed line to the back-up capacitor (CVDD) and via a line impedance (RZV) in the feed line to the back-up capacitor (CVDD).

The second contact of the back-up capacitor (CVDD) is connected to the reference potential (GND) via a line impedance (RZV) and a line inductance (LZV).

Figure 2:
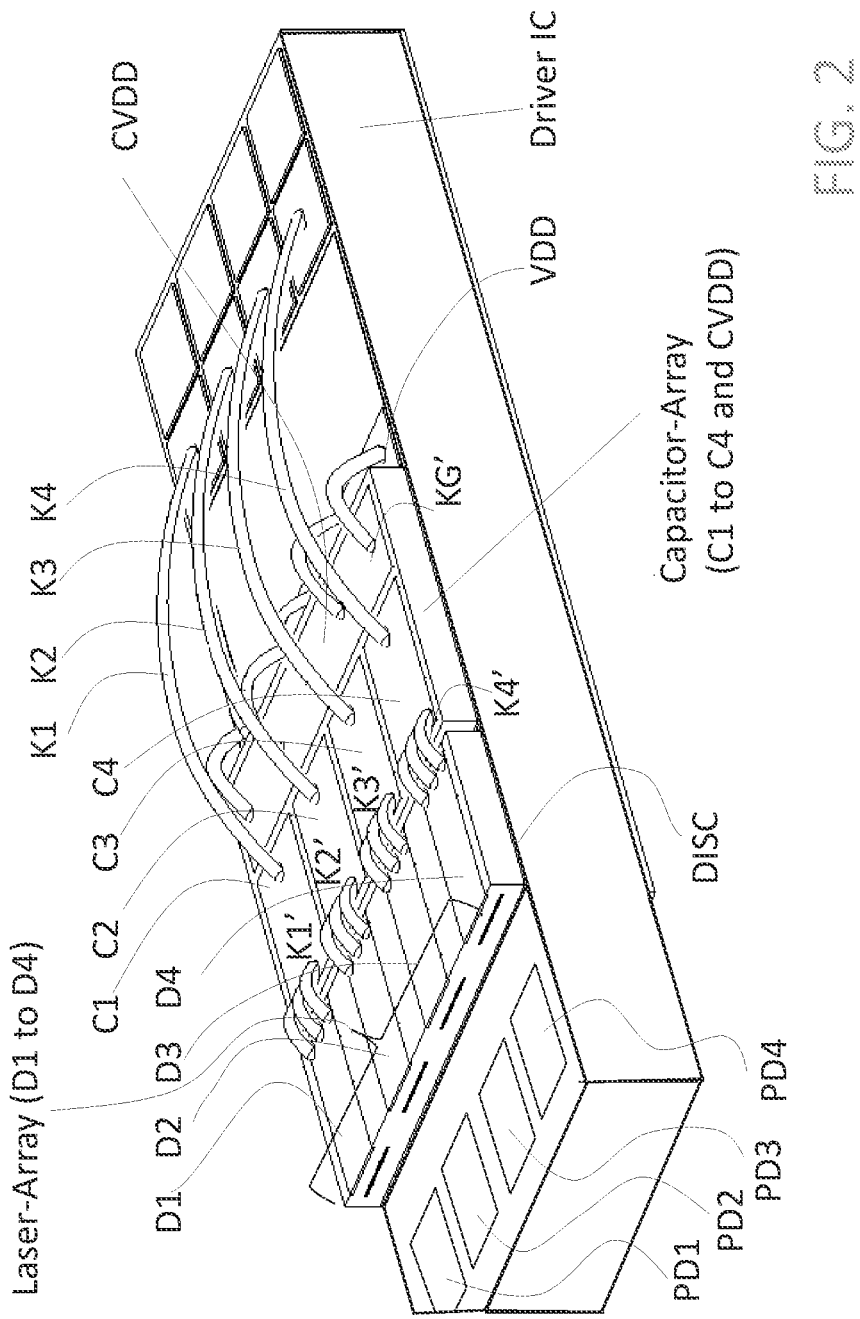
FIG. 2 shows a proposed structure of a laser module for the LIDAR system of FIG. 1.

FIG. 2 shows a proposed structure of a laser submodule of a laser module for the LIDAR system of FIG. 1. The driver IC is the basis of the submodule. The driver IC is preferably a monolithically integrated circuit. It preferably comprises the control circuit (CTR) and all other CMOS-micro-integrable circuit components of FIG. 1. These components would be, e.g., but not limited to, the control circuit (CTR), the driver (Buf), the control switch ($T_{dis}$), and the n charging circuits (B1 to Bn) and the photo detectors (PD1 to PD4). Furthermore, a control circuit (CTR) may comprise, e.g., a microcomputer with memory, interfaces and CPU. Together, these components form the control circuit. The control circuit may comprise further functional components. It may be, e.g., an analog-to-digital converter and an analog multiplexer for detecting the capacitor voltages, which can interact with said microcomputer. Furthermore, it may be comparators, e.g., for the detection of analog threshold excesses or undershoots. It may be a digital-to-analog converter and analog holding circuits that enable analog reference values for such threshold value specifications in analog form. It may be a timer. It may be filters that generate or extract pulse start signals from the value pattern over time of the received signals (es1 to esn). It may be amplitude estimation filters, which determine values and make them available to the microcomputer, and are a function of the respective amplitude of the respective laser pulse of the respective laser. It may be delay estimation filters that determine values and make them available to the microcomputer, and are a function of the respective delay of the respective laser pulse of the respective laser relative to the start signal, e.g., the trigger signal (TRIG). It may be delay elements, which can be set by the microcomputer and which delay the pulse pre-signal (PL) as a function of a specifiable value of the delay time. The microcomputer can set this delay time, for example. In the case of maximum space division multiplexing, the microcomputer can, e.g., set the value of the delay time as a function of the value pattern over time of a received signal of the n received signals (es1 to esn) of the laser submodule, before the next laser pulse is emitted by the laser associated with this received signal. If only one photodetector is provided, the microcomputer can either determine the delay times to be set in time division multiplexing, e.g., by measuring the n delay times of the laser pulse emission, e.g., of each individual laser of the n lasers, or alternatively, determine less than n delay times to be set for groups of lasers. Here, a group of lasers may also include all n lasers (D1 to Dn).

In the example in FIG. 2, by way of example, n=4 lasers (D1 to D4) are used, which are manufactured on a common crystal and form a linear laser array. The bottom of this crystal forms the common cathode, which is electrically connected as the first star point (DISC) to a control switch, which is made in the crystal of the driver IC of the laser submodule of FIG. 2 and is located on its active surface. This flip-chip assembly makes it possible to implement this connection with only low parasitic inductance and impedance values, which increase the edge slope of the respective laser pulses. Thermal cooling of the n lasers thus takes place via the crystal of the driver IC in the example of FIG. 2. The 4 capacitors (C1 to C4) are also designed as a shared plate. In the example in FIG. 2, the second contacts of the 4 capacitors (C1 to C4) are connected to one another by a shared contact. The first contact of each capacitor (C1 to C4) is connected to the laser associated therewith of the four lasers (D1 to D4) via a corresponding discharge line of the four discharge lines (K1' to K4'). The discharge lines (K1' to K4') are particularly short due to the chosen arrangement. The multiple bonding of the discharge lines (K1' to K4') leads to a further reduction of the parasitic inductance and thus to a further increase in the edge slope. Similarly, the short bonding wires of the connection between the second star point and the reference potential (GND) along with multiple bonding also cause a reduction in the parasitic inductance in this connection. This, furthermore, increases the edge slope of the emitted light pulse.

The relatively long bonding wires of the charging lines (K1 to Kn) are more likely to be beneficial for the slope.

A back-up capacitor (CVDD) is part of the capacitor array. The back-up capacitor (CVDD) is connected to the reference potential (GND) on an underside with a second terminal with a very low line impedance (RZV) and a very low line inductance (LZV). The first terminal of the back-up capacitor (CVDD) is connected to the virtual node (KG') of the supply voltage (VDD). The virtual node (KG') of the supply voltage (VDD) is connected to the supply voltage (VDD) with very short bonding wires. As a result, the virtual node (KG') of the supply voltage (VDD) is connected to the supply voltage (VDD) with very low line impedance (RZV) and a very low line inductance (LZV).

In the example of FIG. 2, four photodetectors (PD1 to PD4) are drawn in by way of example, which detect the scattered light of the four lasers (D1 to D4) and convert it into a received signal (es1 to es4). Each of the photodetectors is associated with one laser of the lasers (D1 to D4) to which it is closest. The photodetectors (PD1 to PD4) can, e.g., be PN diodes, or the like.

Figure 3:
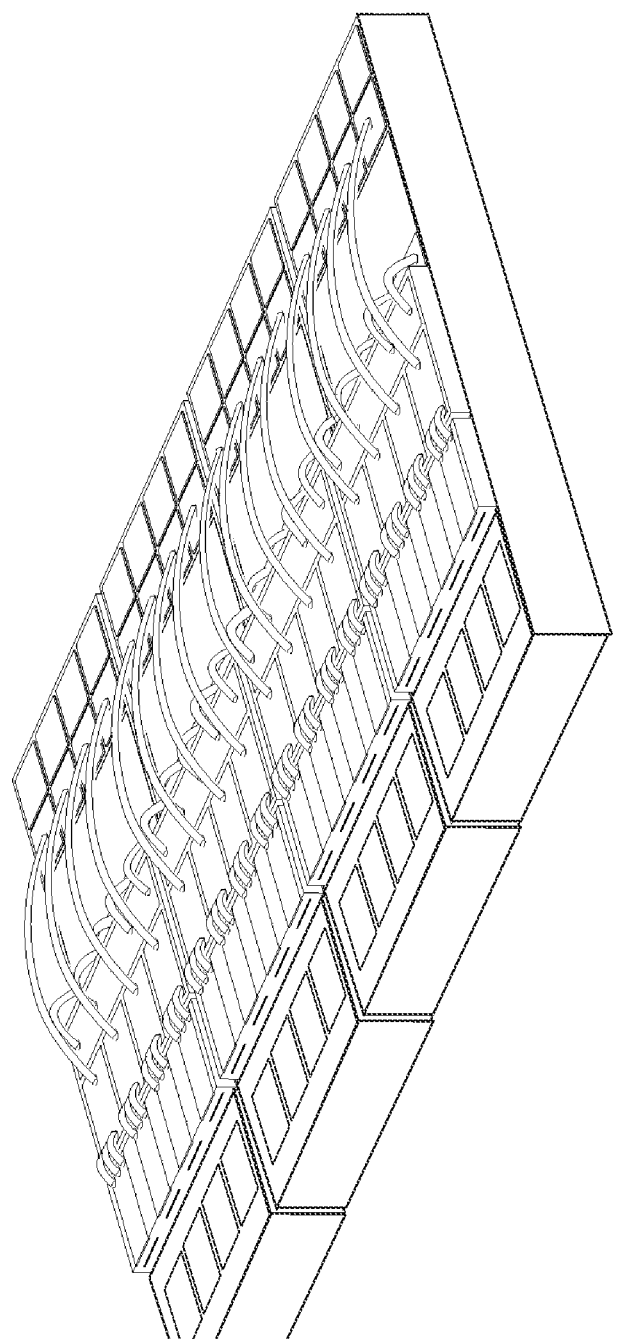
FIG. 3 shows an arrangement with several modules of FIG. 2.

FIG. 3 shows an arrangement, an exemplary laser module with a plurality of laser submodules of FIG. 2. The control logic and the control are preferably designed, such that only one laser of a laser module always generates a light pulse.

Figure 4:
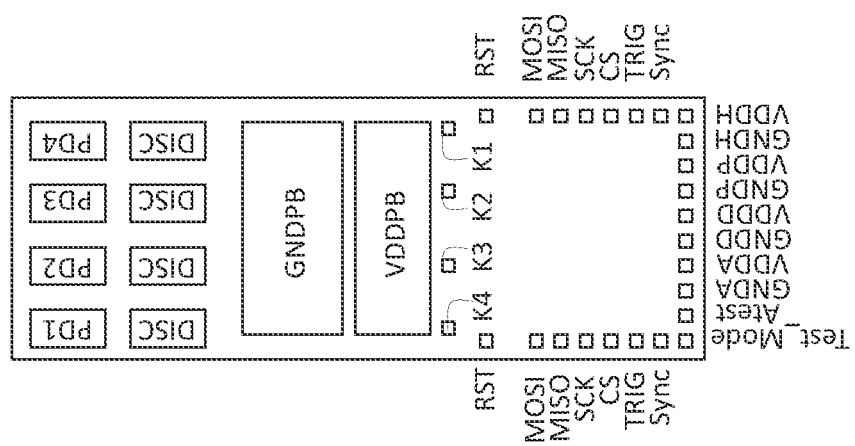
FIG. 4 shows the structure of a proposed driver IC in plan view.

FIG. 4 shows in plan view the structure of a single proposed driver IC for a laser submodule. The structure is grossly simplified and limited to the essential information to enable reworking.

As elsewhere in this specification, the number n of lasers (D1 to Dn) of the module is limited to n=4 for the sake of clarity. The exemplary four photodetectors (PD1 to PDn) are drawn in. The principles of this specification can be applied accordingly to a different number n of lasers. Here, n is used instead of 4, even if the figure shows n=4. In this specification, n should always be a positive integer.

At the top, by way of example, there are four contact areas for the back contacts of the exemplary four lasers (D1 to Dn) of the laser module to be placed thereon subsequently. Each of the four contact surfaces is connected to the first star point (DISC). Instead of four separate contact areas, a single contact area is obviously also conceivable.

Below it, there is a contact (GND) that is connected to the reference potential (GND). The capacitor array (C1 to Cn and CVDD) is placed on this contact surface. As a result, the back contact (KR) of the capacitor array (C1 to Cn and CVDD) and the reference potential (GND) will be connected.

Below it, there is a contact surface for the bonding wires with which the first contact of the back-up capacitor (CVDD) of the capacitor array (C1 to Cn and CVDD), which is the virtual node (KG') of the supply voltage (VDD), is connected to the supply voltage (VDD).

Below it, there are the n bonding areas (here, e.g., n=4) for the outputs of the driver circuits (B1 to Bn) (here n=4). By means of long bonding wires, which represent the charging lines (K1 to Kn)(here n=4), the capacitors (C1 to Cn) of the energy reserves of the lasers (D1 to Dn) (here n=4) are charged by the driver circuits (B1 to Bn).

In the example in FIG. 4, the proposed driver IC of the laser submodule requires a plurality of supply voltages via a plurality of supply voltage contacts (VDDA, GNDA, VDDD, GNDD, VDDP, GNDP, VDDH, GNDH). The result of the elaboration is that it is advantageous to feed the supply voltages to the driver IC with low impedance via the edge of the driver IC opposite the lasers, in that each driver IC can then have its own low-impedance feed line.

Furthermore, the embodiment of the disclosure showed that the driver ICs can loop through signals that can also be sent to the driver ICs at high impedance, through the ICs. For example, the reset signal (RST) in the example in FIG. 4 below represents such a looped-through signal. The reset signal (RST) is preferably connected horizontally to a corresponding terminal on the opposite side of the driver IC. Furthermore, in the example in FIG. 4, this represents an SPI data bus, as an example of a data bus. The input of the SPI data bus (MOSI) and the output of the SPI data bus (MISO) and the clock of the SPI data bus (SCK) have countercomponents on the opposite side of the driver IC. In the example in FIG. 4, the proposed driver IC also loops through a selection signal (Chip Select (CS)). The driver IC also preferably loops through the synchronization signal (Sync) and the trigger signal (TRIG). This ignition signal (TRIG) for firing the laser pulse is thus preferably also fed from one side of the driver IC and looped through unchanged to the other side.

With the edge of this ignition signal (TRIG), the lasers of the laser submodules of a laser module are fired substantially simultaneously.

As a formality, an example of a further synchronization signal (sync) that goes to all driver ICs is shown, and is also looped through. The synchronization signal (Sync) can signal to the driver ICs of the laser submodules a reference point in time common to these laser submodules, upon which the control circuits (CTR) of all driver ICs of all laser submodules synchronize, e.g., the rising edge of the laser pulse actually emitted by a laser by means of a plurality of laser pulse emission passes.

Figure 5:
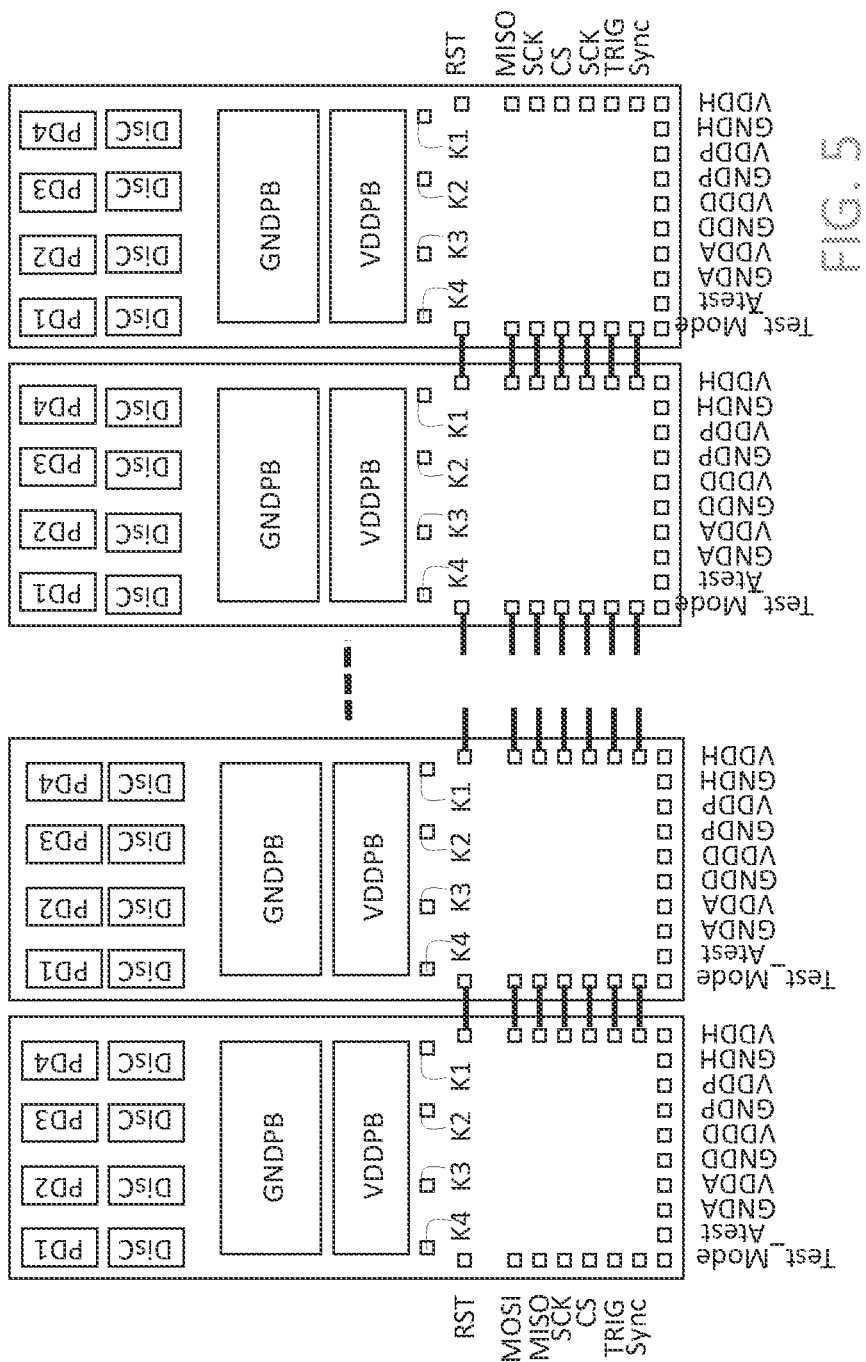
FIG. 5 shows the array of the laser modules on the driver IC level.

FIG. 5 shows the arraying of several laser submodules, here laser submodules of FIG. 4, to form a laser module on the driver IC level.

The contacts on the long sides of two adjacent driver ICs are connected to one another by bonding wires. It is clear that this construction ensures the low-impedance supply of all laser submodules with electrical energy, in that the control signals are looped through.

Figure 6:
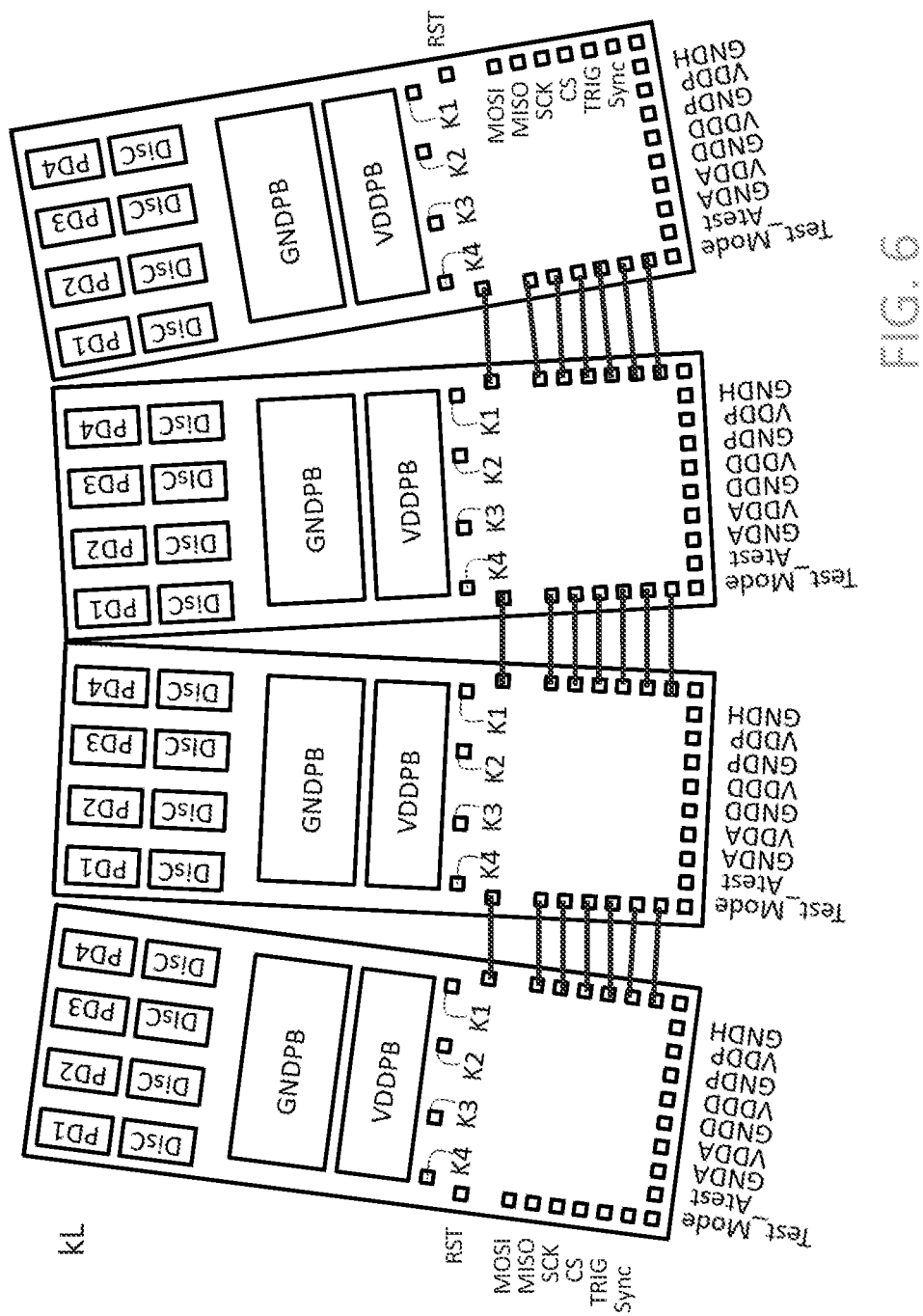
FIG. 6 shows the alignment of the laser modules of FIG. 5 along a curved line.

FIG. 6 shows the alignment of the laser submodules of FIG. 6 along a curved line (kL). This has the advantage that the generation of the laser beam fan is greatly simplified. First, the laser submodules can be aligned perpendicular to this curved line (kL). Second, the lasers within a laser submodule can be aligned along this curved line (kL), such that ultimately all lasers of all laser submodules are aligned along this curved line (kL). The curved line (kL) can be convex or concave. The laser beam of each laser of each laser submodule has a laser beam axis. If only the laser submodules are aligned along the curved line (kL) and if this curved line is a segment of a circle, the laser beam axes of the first laser (D1) of all laser submodules intersect at one point in space. This point may also be situated behind the lasers.

If the lasers (D1 to Dn) of a laser module are aligned along a curved line (kL), the laser beam axes of the lasers (D1 to Dn) of the laser module intersect at one point.

If the lasers (D1 to Dn) of all laser modules are aligned along a curved line (kL), the laser beam axes of the lasers (D1 to Dn) of all laser modules intersect at one point.

Aligning only some of the lasers and/or only some of the laser submodules along the curved line (kL) is particularly comprised in the claims.

Aligning the lasers of a laser submodule along the curved line (kL) within the laser submodule is also conceivable.

Figure 7:
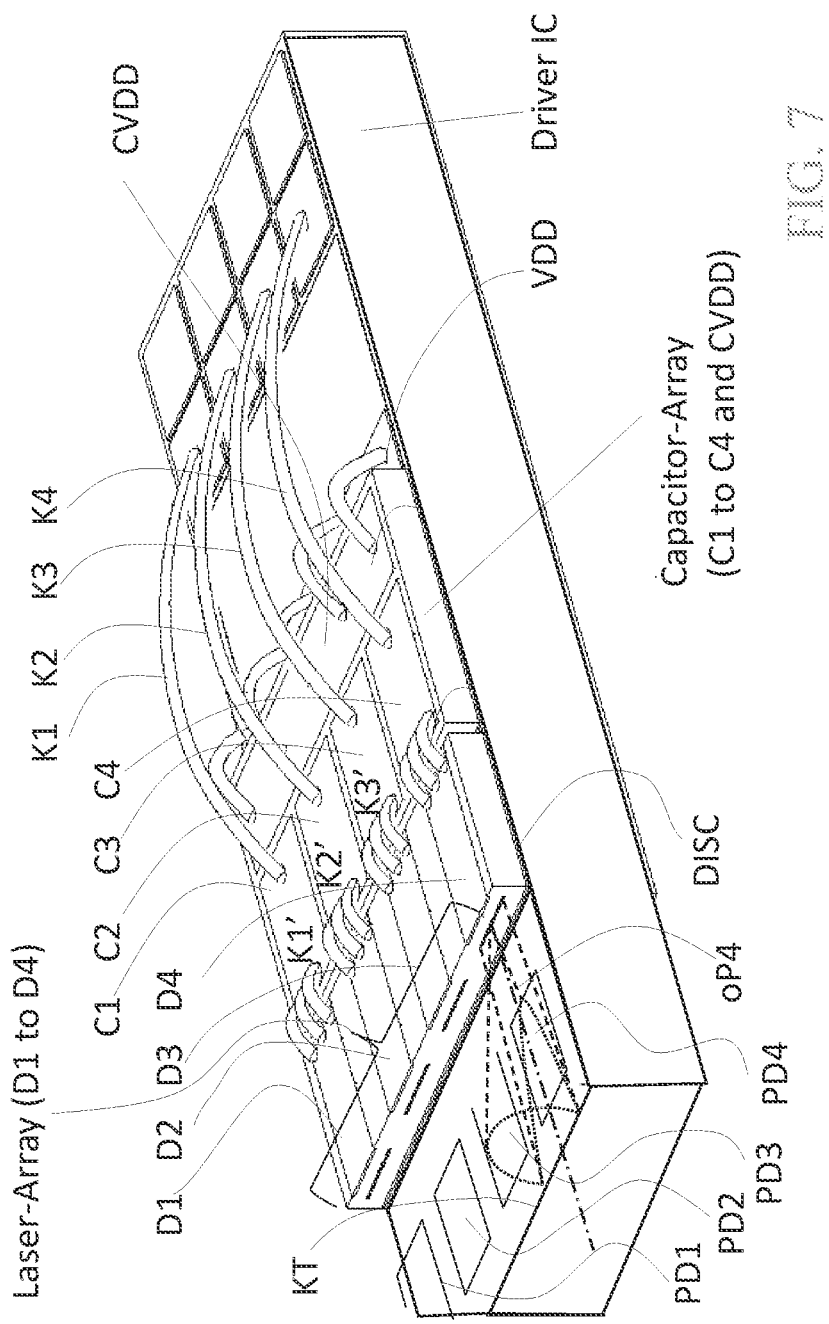
FIG. 7 shows a proposed structure of a laser module for the LIDAR system of FIG. 1 and corresponds to the figure, the optical paths having now been drawn.
Figure 8:
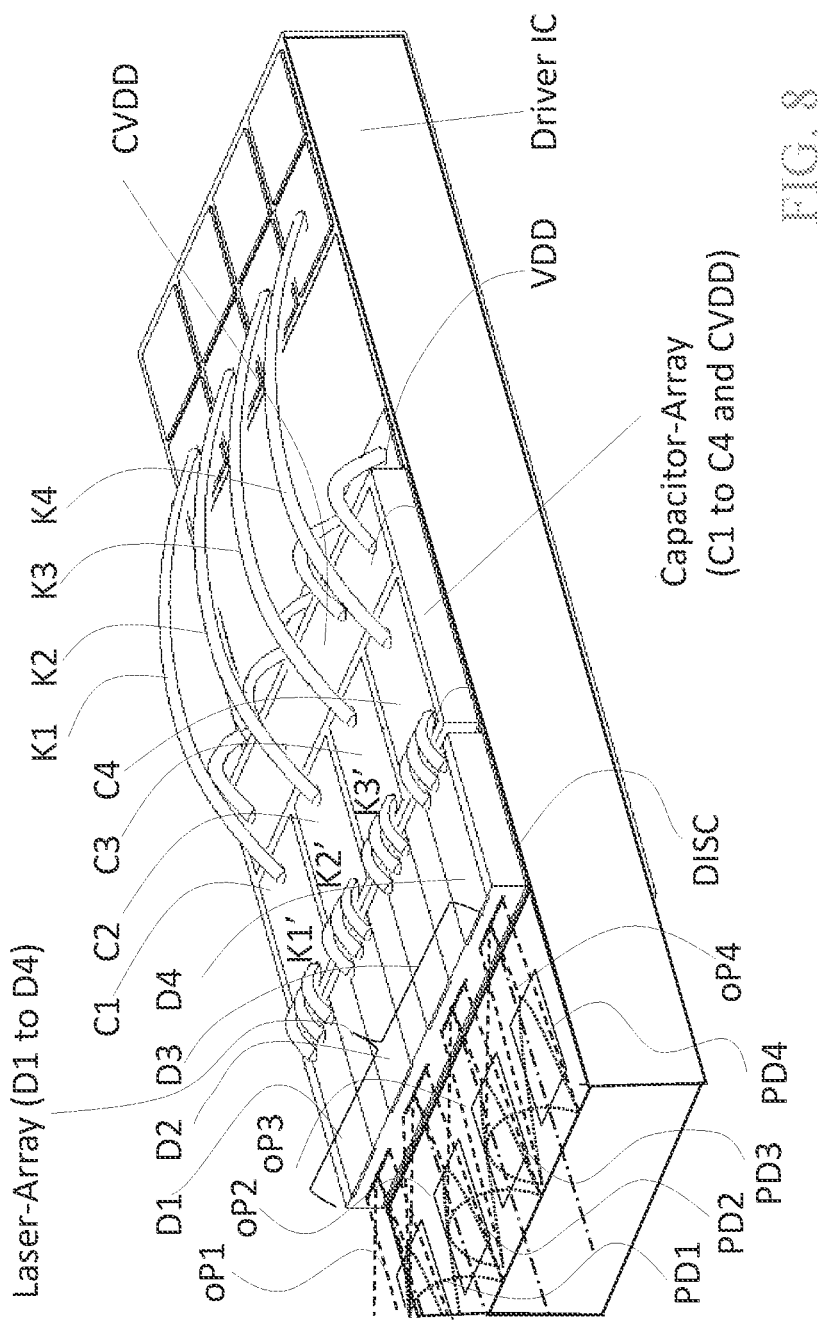
FIG. 8 shows a proposed structure of a laser module for the LIDAR system of FIG. 1 and corresponds to the figure, the optical paths having now been drawn.

FIGS. 7 and 8 show a proposed structure of a laser sub-module of a laser module for the LIDAR system of FIG. 1. FIG. 7 and FIG. 8 correspond to FIG. 2, with the optical paths (oP1 to oP4) in FIG. 7 and the optical path (op4) of the fourth laser diode (D4) are indicated in FIG. 8 by way of example.

In the example in FIG. 7, four photodetectors (PD1 to PD4) are drawn in by way of example. The four photodetectors (PD1 to PD4) detect the scattered light of the four lasers (D1 to D4) and convert it into a received signal (es1 to es4). Each of the photodetectors (P1 to P4) is associated with the most adjacent of the lasers (D1 to D4). The photodetectors (PD1 to PD4) may be, e.g., PN diodes or similar.

According to the disclosure, the lasers (D1 to D1 are edge emitters. The emitted beam along the respective laser beam axis (SA1 to SAn) typically has an elliptical cross-section with a vertical cross-sectional axis of the ellipse and a horizontal cross-sectional axis of the ellipse. Typically, the laser beam is more open vertically than horizontally, since the lasers (D1 to D2) only emit the light from a very thin PN junction, which, due to the Heisenberg's uncertainty principle, leads to beam expansion in the vertical direction. In contrast, the emission of the lasers (D1 to Dn) originates from a layer with a certain width in the horizontal direction. As a result, the laser beam of each of the lasers (D1 to Dn) is less expanded in the horizontal direction. The experiments in the context of the development of the technical teaching presented here showed that the vertically expanded laser beam of a laser of the lasers (D1 to Dn) is expanded to such an extent that an elliptical segment of the laser beam cross-section of this laser beam of this laser is cut by the surface of this photodiode in the vicinity of the photodiode of the photodiodes (D1 to Dn) associated with the laser. This means that the respective laser irradiates with its emission radiation of its laser beam the photodiode associated therewith. This cut laser beam, which strikes the surface, is shown by a parabolic cut by dashed lines on the surface of the driver IC in FIG. 7 and FIG. 8. FIG. 8 shows, by way of example, only one laser beam, for clarity. Essential here is that the respective laser, which is an edge emitter, can directly irradiate the photodetector (PD1 to PDn) associated with it, e.g., a photodiode, with laser radiation.

This idea is unknown from the prior art.

The semiconducting crystal of the driver IC intersects with its edge (KT)(see FIG. 8) the respective laser beams of the respective lasers of (D1 to Dn), such that an undisturbed upper, first elliptical segment of the laser beam forms the actual free-space laser beam, which is used for the LIDAR measurement, and which actually exits the laser module.

In contrast, the semiconducting crystal of the driver IC intersects with its edge (KT) (see FIG. 8) the respective laser beams of the respective lasers of (D1 to Dn) in such a way that a disturbed lower, second elliptical segment of the laser beam is imaged on the surface of the driver IC and there preferably irradiates a photodetector of the n photodetectors (PD1 to PDn) associated with the respective laser of the lasers (D1 to Dn). The associated photodetector converts the received laser radiation of the second elliptical segment of the laser beam into a received signal of the n received signals (es1 to esn) of this respective photodetector. The control circuit (CTR) evaluates the respective received signal of the relevant laser. The control circuit (CTR) preferably checks the relevant received signal for plausibility. During first time periods, when the laser emits a laser pulse, the value of the received signal must be in a first value range. During second time periods, when the laser does not emit a laser pulse, the value of the received signal must be in a second value range. If the value of the received signal is not in the first value range in the first time periods, when the laser emits a laser pulse, the control circuit (CTR) preferably signals an error to a higher-order unit. If the value of the received signal is not within the second value range during the first time periods, when the laser does not emit a laser pulse, the control circuit (CTR) preferably signals an error to a higher-order unit.

REFERENCE SYMBOLS

Atest Second test control signal for activating and controlling a test state of the device;
B1 First charging circuit for the first capacitor (C1), which, optionally, supplies the first laser (D1) with electrical energy in the case of light pulse generation;
B2 Second charging circuit for the second capacitor (C2), which, optionally, supplies the second laser (D2) with electrical energy in the case of light pulse generation;
B3 Third charging circuit for the third capacitor (C3), which, optionally, supplies the third laser (D3) with electrical energy in the case of light pulse generation;
Bn N-th—charging circuit for the n-th capacitor (Cn), which, optionally, supplies the n-th laser (Dn) with electrical energy in the case of light pulse generation;
Buf Driver which amplifies the pulse pre-signal (PL) to form the pulse signal ($G_{dis}$);
C1 First capacitor, which represents the energy reserve for the first laser (D1);
C2 Second capacitor, which represents the energy reserve for the second laser (D2);
C3 Third capacitor, which represents the energy reserve for the third laser (D3);
C4 Fourth capacitor, which represents the energy reserve for the fourth laser (D4);
Cn N-th capacitor, which represents the energy reserve for the n-th laser (Dn);
CS Selection signal;
CTR Control circuit which controls the n charging circuits (B1 to Bn) and generates the pulse pre-signal (PL). The control circuit causes one of the n charging circuits, typically one of the n capacitors, to charge before the generation of a light pulse by one of the n lasers, then switches preferably off preferably all charging circuits, or the charging outputs of preferably all charging circuits to high impedance and then closes the control switch ($T_{dis}$), which initiates the generation of light pulses. The control circuit (CTR) preferably repeats this process until all n lasers (D1 to Dn) have emitted a light pulse, preferably exactly once, and then preferably starts again from the beginning with the next pass;
CVDD Back-up capacitor for stabilizing the supply voltage (VDD);
D1 First laser;
D2 Second laser;
D3 Third laser;
D4 Fourth laser;
DISC First star point. The cathodes of the lasers (D1 to Dn) are preferably connected to the first star point. The first star point (DISC) is connected to the reference potential (GND) by the control switch ($T_{dis}$) when a pulse signal ($G_{dis}$) arrives. If one of the capacitors (C1 to Cn) has been charged beforehand, this capacitor is then discharged via the corresponding laser, which then emits a light pulse;
Dn N-th laser;
es1 First received signal;
es2 Second received signal;
es3 Third received signal;
esn N-th received signal;
$G_{dis}$ Pulse signal;
GND Reference potential;
GNDA Analog reference potential;
GNDD Digital reference potential;
GNDH Reference potential for the high supply voltage;
GNDP Reference potential of interfaces;
GNDPB Reference potential of the back-up capacitor (CVDD);
K1 First charging line, via which the first charging circuit (B1) charges the first capacitor (C1), optionally, before a light pulse is generated by the first laser (D1);
K1' First discharge line via which the first laser (D1) discharges the first capacitor (C1), when the control switch ($T_{dis}$) is closed by the pulse signal ($G_{dis}$);
K2 Second charging line, via which the second charging circuit (B2) charges the second capacitor (C2), optionally, before a light pulse is generated by the second laser (D2);
K2' Second discharge line, via which the second laser (D2) discharges the second capacitor (C2) when the control switch ($T_{dis}$) is closed by the pulse signal ($G_{dis}$);
K3 Third charging line, via which the third charging circuit (B3) charges the third capacitor (C3), optionally, before a light pulse is generated by the third laser (D3);
K3' Third discharge line, via which the third laser (D3) discharges the third capacitor (C3) when the control switch ($T_{dis}$) is closed by the pulse signal ($G_{dis}$);
K4' Fourth discharge line, via which the fourth laser (D4) discharges the fourth capacitor (C4) when the control switch ($T_{dis}$) is closed by the pulse signal ($G_{dis}$);
KG' Supply voltage virtual node (VDD);
kL Optional curved line along which the laser modules are aligned.
Kn N-th charging line, via which the n-th charging circuit (Bn) charges the n-th capacitor (Cn), optionally, before a light pulse is generated by the n-th laser (Dn);
Kn' N-th discharge line, via which the n-th laser (Dn) discharges the n-th capacitor (Cn), when the control switch ($T_{dis}$) is closed by the pulse signal ($G_{dis}$);
KR Back contact;
LC1 Inductance of the line with which the second contact of the first capacitor (C1) is connected to the reference potential (GND);
LC2 Inductance of the line with which the second contact of the second capacitor (C2) is connected to the reference potential (GND);
LC3 Inductance of the line with which the second contact of the third capacitor (C3) is connected to the reference potential (GND);
LCn Inductance of the line with which the second contact of the n-th capacitor (Cn) is connected to the reference potential (GND);
LZV Line inductance between the second terminal of the back-up capacitor (CVDD) and the reference potential (GND);

LZ1 Inductance of the first charging line (K1), via which the first charging circuit (B1) charges the first capacitor (C1), optionally, before a light pulse is generated by the first laser (D1);
LZ2 Inductance of the second charging line (K2), via which the second charging circuit (B2) charges the second capacitor (C2), optionally, before a light pulse is generated by the second laser (D2);
LZ3 inductance of the third charging line (K3), via which the third charging circuit (B3) charges the third capacitor (C3), optionally, before a light pulse is generated by the third laser (D3);
LZn Inductance of the n-th charging line (Kn), via which the n-th charging circuit (Bn) charges the n-th capacitor (Cn), optionally before a light pulse is generated by the n-th laser (Dn);
LZV Line inductance of the feed line to the back-up capacitor (CVDD);
MOSI Input of the SPI data bus;
MISO Output of the SPI data bus;
oP1 First optical path;
oP2 Second optical path;
oP3 Third optical path;
oPn N-th optical path;
PD1 First photodetector;
PD2 Second photodetector;
PD3 Third photo detector;
PD4 Fourth photodetector,
PDn N-th photodetector,
PL Pulse pre-signal;
RC1 Impedance of the line with which the second contact of the first capacitor (C1) is connected to the reference potential (GND);
RC2 Impedance of the line with which the second contact of the second capacitor (C2) is connected to the reference potential (GND);
RC3 Impedance of the line with which the second contact of the third capacitor (C3) is connected to the reference potential (GND);
RCn Impedance of the line with which the second contact of the n-th capacitor (Cn) is connected to the reference potential (GND);
RZV Line impedance between the second terminal of the back-up capacitor (CVDD) and the reference potential (GND);
RST Reset signal;
RZ1 Impedance of the first charging line (K1), via which the first charging circuit (B1) charges the first capacitor (C1), optionally before a light pulse is generated by the first laser (D1);
RZ2 Impedance of the second charging line (K2), via which the second charging circuit (B2) charges the second capacitor (C2), optionally before a light pulse is generated by the second laser (D2);
RZ3 Impedance of the third charging line (K3), via which the third charging circuit (B3) charges the third capacitor (C3), optionally before a light pulse is generated by the third laser (D3);
RZV Line impedance of the feed line to the back-up capacitor (CVDD);
RZn Impedance of the n-th charging line (Kn), via which the n-th charging circuit (Bn) charges the n-th capacitor (Cn), optionally before a light pulse is generated by the n-th laser (Dn);
SCK Clock signal of the SPI data bus;
Sync Synchronization signal that goes to all laser submodules;
$T_{dis}$ Control switch. The control switch ($T_{dis}$) is preferably a transistor;
Test_Mode First test control signal for activating and controlling a test state of the device;
TRIG Trigger signal which causes the driver IC in a predetermined signal state to fire its lasers (D1 to Dn);
VDD Supply voltage;
VDDA Analog supply voltage;
VDDD Digital supply voltage;
VDDH High supply voltage;
VDDP Supply voltage of the interfaces;
VDDPB Supply voltage node of the back-up capacitor (CVDD);

CITATIONS

DE 19 514 062 A1,
DE 19 546 563 C2,
DE 19 914 362 A1,
DE 10 2006 036 167 B4,
DE 10 2008 021 588 A1,
DE 10 2009 060 873 A1,
DE 10 2014 105 482 A1,
DE 10 2016 116 368 A1,
DE 10 2016 116 369 A1,
DE 10 2016 116 875 A1,
DE 10 2017 100 879 A1,
DE 10 2017 121 713 A1,
DE 10 2018 106 861 A1,
DE 10 2019 131 460.7,
DE 10 2020 111 075.8,
DE 10 2020 114 782.1,
DE 10 2020 124 564.5,
EP 2 002 519 A2,
EP 3 301 473 A1,
PCT/EP2021/050199,
U.S. Pat. No. 6,697,402 B2,
U.S. Pat. No. 9,185,762 B2,
U.S. Pat. No. 9,368,936 B1,
U.S. Pat. No. 10,193,304 B2.

We claim:
1. A laser submodule comprising:
a linear laser array of n lasers (D1 to Dn);
n capacitors (C1 to Cn);
a control switch ($T_{dis}$);
n charging circuits (B1 to Bn);
a control circuit (CTR); and
a driver IC;
wherein:
n is a positive integer greater than 2;
the driver IC is a monolithic integrated circuit;
the driver IC comprises the control circuit (CTR) and the control switch ($T_{dis}$) and the n charging circuits (B1 to Bn);
each capacitor of the n capacitors (C1 to Cn) has a respective first terminal and a respective second terminal;
each charging circuit of the n charging circuits (B1 to Bn) selectively charges one of the n capacitors (C1 to Cn), hereinafter referred to as the capacitor associated with the charging circuit;
the control circuit (CTR) controls the charging circuits (B1 to Bn);
each laser of the n lasers (D1 to Dn) is associated with a respective capacitor of the n capacitors (C1 to Cn);
the control circuit (CTR) controls the control switch ($T_{dis}$);

the control switch ($T_{dis}$) discharges the capacitor of the n capacitors (C1 to Cn), which is charged via the laser associated with the respective capacitor;

the associated laser emits a laser pulse in each case only when the capacitor associated with the laser was charged and the control switch ($T_{dis}$) connects a cathode of the laser to a reference potential (GND);

the laser submodule includes at least one photodetector;

the laser associated with the capacitor is optically coupled to the at least one photodetector via an optical path;

the at least one photodetector generates a received signal with a value pattern over time as a function of an amplitude pattern over time of a light pulse generation of the laser optically coupled to the at least one photodetector;

the control circuit (CTR) determines a parameter of the value pattern over time of the received signal from the value pattern over time of the received signal;

the control circuit (CTR) controls and/or monitors a light pulse generation of the laser associated with the capacitor as a function of the parameter;

the driver IC comprises the at least one photodetector; and the n lasers (D1 to Dn) of the linear laser array of n lasers (D1 to Dn) are made on a common crystal;

and further wherein:

an underside of the common crystal forms a common cathode of the n lasers (D1 to Dn);

the common cathode of the n lasers (D1 to Dn) is electrically connected to the control switch ($T_{dis}$) as a first star point (DISC);

the common cathode is located on an active surface of the common crystal; and the underside of the common crystal with the common cathode is placed on the first star point (DISC).

2. The laser submodule according to claim 1, wherein the parameter is a value of a real time delay between an arrival of a time feature of a trigger signal (TRIG) for the emission of the laser pulse by the associated laser at the control circuit (CTR) and an occurrence of a time feature for the emission of the laser pulse in the value pattern over time of the received signal.

3. The laser submodule according to claim 2, wherein:

the control circuit (CTR) causes the control switch ($T_{dis}$) to connect the associated laser to the reference potential after a delay time has elapsed, and the delay time begins with the arrival of the time feature of a start signal (TRIG) for the emission of a laser pulse by the associated laser at the control circuit (CTR) as a start time.

4. The laser submodule according to claim 3, wherein the control circuit (CTR) regulates the delay time as a function of the parameter.

5. The laser submodule according to claim 4, wherein the control circuit (CTR) regulates the delay time to assume a delay time target value.

6. The laser submodule according to claim 5, wherein the control circuit (CTR) regulates the delay time, such that a point in time of the occurrence of the time feature for the real emission of the laser pulse in the value pattern over time of the received signal is synchronous with a fixed temporal shift to a time feature in the value pattern over time of a synchronous signal.

7. The laser submodule according to one or more of claim 1, wherein the parameter is a value which is a function of an effect of an amplitude pattern over time of the laser pulse in the value pattern over time of the received signal.

8. The laser submodule according to claim 7, wherein:

the control circuit (CTR) causes the charging circuit belonging to the laser to charge the capacitor associated with the laser with a charging current prior to a closing of the control switch ($T_{dis}$); and the control circuit (CTR) controls an amount of energy with which the charging circuit charges the capacitor.

9. The laser submodule according to claim 8, wherein the control circuit (CTR) regulates the amount of energy with which the charging circuit can charge the capacitor as a function of the parameter.

10. The laser submodule according to claim 9, wherein:

the control circuit (CTR) causes the charging circuit to charge the capacitor to a capacitor voltage with a charging current having a charging current value during a charging period;

the charging period is limited by a charging period default value; and the control circuit (CTR) regulates the amount of energy with which the charging circuit charges the capacitor during the charging period as a function of the parameter, in that the control circuit (CTR) changes the charging period default value after emission of a laser pulse by the laser as a function of the parameter for the next consecutive charge of the capacitor in preparation for the next emission of a laser pulse by the laser as a function of the parameter.

11. The laser submodule according to claim 10, wherein the control circuit (CTR) regulates the charging period default value, such that the value of the parameter of the value pattern over time of the received signal being a function of the amplitude of the laser pulse emitted by the laser corresponds to a programmable parameter default value as the nominal value.

12. The laser submodule according to claim 9, wherein:

the control circuit (CTR) causes the charging circuit to charge the capacitor to a capacitor voltage with a charging current having a charging current value during a charging period;

the control circuit (CTR) detects a capacitor voltage during the charging period of the capacitor;

the control circuit (CTR) causes the charging circuit to stop charging the capacitor with the charging current, when a value of the capacitor voltage reaches or exceeds a value of a capacitor target voltage;

the control circuit (CTR) regulates the amount of energy with which the charging circuit charges the capacitor during the charging period as a function of the parameter by changing the value of the capacitor target voltage after emission of a laser pulse by the laser as a function of the parameter for the next consecutive charge of the capacitor in preparation for the next emission of a laser pulse by the laser as a function of the parameter.

13. The laser submodule according to claim 12, wherein the control circuit (CTR) regulates the value of the capacitor target voltage, such that the value of the parameter of the value pattern over time of the received signal being a function of the amplitude of the laser pulse emitted by the laser corresponds to a programmable parameter default value as the nominal value.

14. The laser submodule according to claim 9, wherein:
the control circuit (CTR) causes the charging circuit to charge the capacitor to a capacitor voltage with a charging current having a charging value during a charging period; and
the control circuit (CTR) regulates the amount of energy with which the charging circuit charges the capacitor during the charging period as a function of the parameter, such that the control circuit (CTR) changes the charging current value after emission of a laser pulse by the laser as a function of the parameter for the next consecutive charging of the capacitor in preparation for the next emission of a laser pulse by the laser as a function of the parameter.

15. The laser submodule according to claim 14,
wherein the control circuit (CTR) regulates the charging current value, such that the value of the parameter of the value pattern over time of the received signal, which is a function of the amplitude of the laser pulse emitted by the laser, corresponds to a programmable parameter default value as the nominal value.

16. The laser submodule according to one or more of claim 1, wherein:
the control circuit (CRT) or another sub-device compares the value of the parameter of the value pattern over time of the received signal with an expected value interval; and
the control circuit (CRT) signals an error or generates and/or stores the information about an error, if the value of the parameter of the value pattern over time of the received signal is outside the expected value interval of the value of the parameter of the value pattern over time of the received signal.

17. A laser module, including a plurality of laser submodules according to claim 1, wherein:
the plurality of laser modules includes at least a first laser submodule and a second laser module; and
the control circuits (CTR) of the first laser submodule and second laser submodule regulate the amplitude of the pulses of the lasers of their respective submodules to assume a same peak amplitude value and/or a same value of a time integral of the amplitude pattern of the pulses of the lasers of their respective submodules, wherein the term "same" in the context means that the peak amplitude values and/or the values of the time integral of the amplitude patterns of the pulses of the lasers of the first laser submodule do not differ by more than 10% from the peak amplitude values and/or the values of the time integrals of the amplitude patterns of the laser pulses of the lasers of the second laser submodule.

18. A laser module, including a plurality of laser submodules according to claim 1, wherein:
the plurality of laser modules includes at least a first laser submodule and a second laser module;
the laser module includes a synchronization signal (Sync);
the laser module includes a trigger signal (TRIG);
the synchronization signal (Sync) and the trigger signal (TRIG) are in a fixed temporal phase relationship;
the first laser submodule is connected to the synchronization signal (Sync);
the first laser submodule is connected to the trigger signal (TRIG);
the second laser submodule is connected to the synchronization signal (Sync);
the second laser submodule is connected to the trigger signal (TRIG);
the control circuit (CTR) of the first laser submodule regulates the time delay between the occurrence of a time feature in the value pattern over time of the trigger signal (TRIG) and the emission of the laser pulse by the lasers of the first laser submodule, such that a time feature of the amplitude pattern over time of the laser pulses of the lasers of the first laser submodule occurs substantially at a same point in time as a first time feature of the synchronization signal (Sync);
the control circuit (CTR) of the second laser submodule regulates the time delay between the occurrence of a time feature in the value pattern over time of the trigger signal (TRIG) and the emission of the laser pulses by the lasers of the second laser submodule, such that a time feature of the amplitude patterns over time of the laser pulses of the lasers of the second laser submodule occurs substantially at the same point in time a second time feature of the synchronization signal (Sync).

19. A laser submodule, comprising:
a linear laser array of n lasers (D1 to Dn);
n capacitors (C1 to Cn); a control switch ($T_{dis}$);
n charging circuits (B1 to Bn); a control circuit (CTR); and
a driver IC;
wherein:
n is a positive integer greater than 2;
the driver IC is a monolithic integrated circuit;
the driver IC comprises the control circuit (CTR) and the control switch ($T_{dis}$) and the n charging circuits (B1 to Bn);
each capacitor of the n capacitors (C1 to Cn) has a respective first terminal and a respective second terminal;
each charging circuit of the n charging circuits (B1 to Bn) selectively charges one capacitor of the n capacitors (C1 to Cn), respectively, hereinafter referred to as the capacitor associated with the charging circuit;
the control circuit (CTR) controls the charging circuits (B1 to Bn);
each capacitor of the n capacitors (C1 to Cn) is associated with a laser of the n lasers (D1 to Dn);
the control circuit (CTR) controls the control switch ($T_{dis}$);
the control switch ($T_{dis}$) discharges the capacitor of the n capacitors (C1 to Cn) which is charged via the laser associated with the capacitor;
an anode of the laser associated therewith is electrically connected to the associated capacitor;
the associated laser then only emits a laser pulse in the form of a laser beam in each case when the capacitor associated with the laser was charged and the control switch ($T_{dis}$) connects a cathode of the laser to a reference potential (GND);
the laser beam includes an elliptical cross section of the intensity distribution of the laser radiation perpendicular to the direction of propagation of the laser beam; and
the laser submodule includes at least one photodetector;
the driver IC comprises at least one photodetector;
and further wherein:
the laser associated with the capacitor is optically directly coupled to at least one photodetector via an optical path;
the lasers (D1 to Dn) are edge emitters;
the semiconducting crystal of the driver IC with one of its edges (KT) cuts the laser beam of the laser such that an undisturbed upper, first elliptical segment of the laser beam forms the actual free space laser beam, a disturbed lower, second elliptical segment of the laser beam is depicted on the surface of the driver IC, the disturbed lower, second elliptical segment on the surface of the driver IC irradiates the at least one photodetector associated with the laser;

the at least one photodetector generates a received signal with a value pattern over time as a function of the amplitude pattern over time of the light pulse generation of the laser thus optically directly coupled to the at least one photodetector;

the control circuit (CTR) determines a parameter of the value pattern over time of the received signal from the value pattern over time of the received signal (es1); and that the control circuit (CTR) controls and/or monitors the generation of a light pulse of the laser associated with the capacitor as a function of the parameter.

20. A laser submodule, comprising:
a linear laser array of n lasers (D1 to Dn);
n capacitors (C1 to Cn);
a control switch ($T_{dis}$);
n charging circuits (B1 to Bn);
a control circuit (CTR); and a driver IC;
wherein:
n is a positive integer greater than 2;
the driver IC is a monolithic integrated circuit;
the driver IC comprises the control circuit (CTR) and the control switch ($T_{dis}$) and the n charging circuits (B1 to Bn);
each capacitor of the n capacitors (C1 to Cn) has a respective first terminal and a respective second terminal;
each charging circuit of the n charging circuits (B1 to Bn) can selectively charge one capacitor of the n capacitors (C1 to Cn), respectively, hereinafter referred to as the capacitor associated with the charging circuit;
the control circuit (CTR) controls the charging circuits (B1 to Bn);
each capacitor of the n capacitors (C1 to Cn) is associated with a laser of the n lasers (D1 to Dn);
the control circuit (CTR) controls the control switch ($T_{dis}$);

the control switch ($T_{dis}$) discharges the capacitor of the n capacitors (C1 to Cn) which is charged via the laser associated with the capacitor;

an anode of the laser associated therewith is electrically connected to the associated capacitor;

the associated laser then only emits a laser pulse in a form of a laser beam when the capacitor associated with the laser was charged and the control switch ($T_{dis}$) connects a cathode of the laser to a reference potential (GND);

the laser submodule has at least one photodetector;
the driver IC comprises at least one photodetector;
and further wherein:
the n lasers (D1 to Dn) of the linear laser array of n lasers (D1 to Dn) are made on a common crystal of the linear laser array;

an underside of the common crystal of the linear laser array forms a common cathode of the n lasers (D1 to Dn);

the common cathode of the laser array of the n lasers (D1 to Dn) is electrically connected to a terminal of the control switch ($T_{dis}$) directly by means of a solder or an electrically conductive adhesive as a first star point (DISC);

the laser associated with the capacitor is optically directly coupled to the at least one photodetector via an optical path;

a part of a laser beam of the laser associated with the capacitor directly irradiates the at least one photodetector in a straight path;

the laser associated with the capacitor is an edge emitter;
the at least one photodetector generates a received signal with a value pattern over time as a function of the amplitude pattern over time of the light pulse generation of the laser which is thus optically directly coupled to the at least one photodetector;

the control circuit (CTR) determines a parameter of the value pattern over time of the received signal from the value pattern over time of the received signal;

the control circuit (CTR) controls and/or monitors the generation of a light pulse of the laser associated with the capacitor as a function of the parameter.

\* \* \* \* \*